United States Patent
Yamamoto

(10) Patent No.: US 7,857,029 B2
(45) Date of Patent: *Dec. 28, 2010

(54) METHOD FOR JOINING ADHESIVE TAPE TO SEMICONDUCTOR WAFER, METHOD FOR SEPARATING PROTECTIVE TAPE FROM SEMICONDUCTOR WAFER, AND APPARATUSES USING THE METHODS

(75) Inventor: Masayuki Yamamoto, Osaka (JP)

(73) Assignee: Nitto Denko Corporation, Osaka (JP)

( * ) Notice: Subject to any disclaimer, the term of this patent is extended or adjusted under 35 U.S.C. 154(b) by 321 days.

This patent is subject to a terminal disclaimer.

(21) Appl. No.: 11/878,823

(22) Filed: Jul. 27, 2007

(65) Prior Publication Data

US 2008/0023134 A1  Jan. 31, 2008

(30) Foreign Application Priority Data

Jul. 31, 2006  (JP) .............................. 2006-208119

(51) Int. Cl.
*H01L 21/00* (2006.01)
(52) U.S. Cl. ..................................... 156/584; 156/538
(58) Field of Classification Search ................. 156/344, 156/584, 538
See application file for complete search history.

(56) References Cited

U.S. PATENT DOCUMENTS 5,171,398 A * 12/1992 Miyamoto ................... 156/552
5,821,166 A * 10/1998 Hajime et al. ............... 438/691
6,706,618 B2 * 3/2004 Takisawa et al. ............ 438/457
7,559,826 B2 * 7/2009 Sekiya ......................... 451/41
2003/0092288 A1 * 5/2003 Yamamoto et al. .......... 438/800
2005/0126694 A1 * 6/2005 Yamamoto ................... 156/584
2006/0181098 A1 * 8/2006 Iida ............................. 294/164

FOREIGN PATENT DOCUMENTS

JP  2002-124494  4/2002

* cited by examiner

*Primary Examiner*—Khanh Nguyen
*Assistant Examiner*—John Blades
(74) *Attorney, Agent, or Firm*—Cheng Law Group, PLLC

(57) ABSTRACT

An annular convex portion is formed along an outer periphery of a back face of a wafer so as to surround a ground area in the back face. The wafer is placed on a holding table with its front face directed upward. A locking member of the holding table supports and contacts the outer periphery of the annular convex portion, thereby securing the wafer. In this state, a separating adhesive tape is supplied toward a surface of a protective tape joined to the front face of the wafer. Then, a joining member presses the adhesive tape against the wafer, thereby joining the adhesive tape to the surface of the protective tape. Further, a guide member guides the adhesive tape joined to the protective tape in a reverse direction, Thus, the adhesive tape and the protective tape are simultaneously separated from the front face of the wafer.

24 Claims, 17 Drawing Sheets

METHOD FOR JOINING ADHESIVE TAPE TO SEMICONDUCTOR WAFER, METHOD FOR SEPARATING PROTECTIVE TAPE FROM SEMICONDUCTOR WAFER, AND APPARATUSES USING THE METHODS

BACKGROUND OF THE INVENTION (1) Field of the Invention

The present invention relates to a method for joining a separating adhesive tape to a protective tape joined to a front face (a face on which a pattern is formed) of a semiconductor wafer (hereinafter, simply referred to as "wafer"), a method for separating the protective tape from the front face of the wafer by means of the separating adhesive tape, and apparatuses using the methods.

(2) Description of the Related Art

After completion of a pattern forming process, a semiconductor wafer is subjected to a back grinding process in a state that a protective tape is joined to a front face of the semiconductor wafer in order to protect a pattern. Thereafter, the protective tape is previously separated from the front face of the wafer, and then the wafer is subjected to a dicing process in which the wafer is divided into chips.

JP-A 2002-124494 discloses one example of a technique for separating a protective tape from a front face of a wafer. According to this technique, a wafer is held by a table in a state that a front face, to which a protective tape is joined, of the wafer is directed upward. Then, a separating adhesive tape is joined to the protective tape while being separated in a reverse direction. Thus, the protective tape joined to and integrated with the adhesive tape is separated from the front face of the wafer.

Recently, a wafer is made thinner in response to needs for size reduction and high-density package as to an electronic device. However, a wafer made thin so as to have a thickness of several tens of micrometers becomes cracked or chipped readily due to occurrence of warpage. Consequently, there is a high possibility that such wafer is damaged in various processing and handling. In order to avoid such disadvantage, there is the following proposition. That is, a center of a wafer is ground in a back grinding process to form an annular convex portion at an outer periphery of a back face of the wafer; thus, the wafer is allowed to have rigidity. That is, the wafer is processed so as to be less susceptible to damage in handling.

The annular convex portion left on the wafer brings rigidity capable of withstanding warpage. Therefore, such wafer facilitates handling without being damaged. If the wafer is held by the table in a state that a back face thereof is directed downward, however, the annular convex portion comes into contact with the table, but a flat concave portion corresponding to the center of the back face of the wafer does not come into contact with the table. Consequently, there is a problem that it is impossible to join a separating adhesive tape to a wafer, which has been made thin, with good accuracy and to separate the separating adhesive tape together with a protective tape from the wafer with good accuracy.

SUMMARY OF THE INVENTION

The present invention is devised in view of the aforementioned circumstances. An object of the present invention is to provide a method for joining a separating adhesive tape to a semiconductor wafer, a method for separating a protective tape from the semiconductor wafer, and apparatuses using these methods, each producing the following effect: it is possible to perform joining of the separating adhesive tape and separation of the protective tape using the separating adhesive tape with good accuracy without damage of the semiconductor wafer even when the semiconductor wafer has been made thin.

In order to accomplish the aforementioned object, the present invention adopts the following configuration:

A method for joining a separating adhesive tape to a protective tape joined to a front face of a semiconductor wafer, the method comprising the steps of: preparing a semiconductor wafer having a back face on which an annular convex portion is formed along an outer periphery so as to surround a back-ground area; placing the semiconductor wafer on a holding table in a state that a front face of the semiconductor wafer is directed upward and, also, allowing a locking member of the holding table to support the outer periphery of the annular convex portion such that the locking member comes into contact with the outer periphery of the annular convex portion, for securing the semiconductor wafer; supplying fluid from a side of the holding table into a space defined between the back face of the semiconductor wafer and the holding table, for increasing an internal pressure in the space; supplying a separating adhesive tape toward a surface of a protective tape joined to the front face of the semiconductor wafer; and allowing a joining member, which has a width larger than an outer diameter of the semiconductor wafer, to move from a first end to a second end of the semiconductor wafer such that the joining member presses a non-adhesive surface of the adhesive tape against the surface of the protective tape, for joining the adhesive tape to the surface of the protective tape.

In this method according to the present invention, a semiconductor wafer is subjected to back grinding so as to have a thickness of several tens of micrometers. Such semiconductor wafer is reinforced with an annular convex portion formed at an outer periphery of a back face thereof. Accordingly, it is possible to prevent the semiconductor wafer from being disadvantageously bent or warped in handling or another processing.

In a case that a separating adhesive tape is to be joined to a protective tape joined to a front face of the semiconductor wafer, fluid is supplied into a space defined inside the semiconductor wafer, so that a pressure in the space is appropriately increased. Also in this state, the locking member supports the outer periphery of the annular convex portion so as to come into contact with the outer periphery of the annular convex portion; thus, the wafer is tightly secured to the holding table. As a result, it is possible to prevent the fluid from being leaked from an interface between the holding table and the wafer. This is particularly effective in a case that the annular convex portion has a narrow width or in a case that a flat front face of the wafer cannot be suction held.

Herein, the width of the joining member is larger than an outer diameter of the semiconductor wafer. Therefore, a position pressed by the joining member is restricted by the annular convex portion formed along the outer periphery of the back face of the wafer placed on the holding table. That is, even when the joining member presses a thin portion of the wafer, which does not come into contact with the holding table, the wafer is prevented from being largely deformed so as to swell downward. Thus, an adhesive tape can be joined to, with good accuracy, the wafer which is reinforced with the annular convex portion and has an uneven thickness due to the formation of the irregularities on the back face thereof.

In this method, preferably, the fluid is supplied into the space while an outflow of the fluid from the space is permitted, so that a pressure in the space is increased. For example, a fine hole formed on the holding table permits the outflow of the fluid.

With this configuration, when the internal pressure in the space defined between the back face of the semiconductor wafer and the holding table is increased, the semiconductor wafer is deformed so as to slightly swell upward. That is, when the joining member is pressed against the semiconductor wafer from above, the semiconductor wafer is flattened. When the semiconductor wafer is flattened and then the space is reduced in volume as compared with the time when the semiconductor wafer swells upward, the internal air is discharged from the space, so that an increase in inner pressure is suppressed.

In this method, preferably, the joining member moves slowly at an adhesive tape joining start position. Also preferably, a pressing force of the joining member to be applied to the annular convex portion corresponding to the adhesive tape joining start position is larger than a pressing force of the joining member to be applied to the flat concave portion formed inside the annular convex portion. With this configuration, the adhesive tape can be brought into close contact with the protective tape.

In order to accomplish the aforementioned object, the present invention also adopts the following configuration:

A method for separating from a semiconductor wafer a protective tape joined to a front face of the semiconductor wafer, the method comprising the steps of: preparing a semiconductor wafer having a back face on which an annular convex portion is formed along an outer periphery so as to surround a back-ground area placing the semiconductor wafer on a holding table in a state that a front face of the semiconductor wafer is directed upward and, also, allowing a locking member of the holding table to support the outer periphery of the annular convex portion such that the locking member comes into contact with the outer periphery of the annular convex portion, for securing the semiconductor wafer; supplying fluid from a side of the holding table into a space defined between the back face of the semiconductor wafer and the holding table, for increasing an internal pressure in the space; supplying a separating adhesive tape toward a surface of a protective tape joined to the front face of the semiconductor wafer; allowing a joining member, which has a width larger than an outer diameter of the semiconductor wafer, to move from a first end to a second end of the semiconductor wafer such that the joining member presses a non-adhesive surface of the adhesive tape against the surface of the protective tape, for joining the adhesive tape to the surface of the protective tape; and allowing a guide member, which moves from the first end to the second end of the semiconductor wafer, to guide the joined separating adhesive tape in a reverse direction, for separating the protective tape integrated with the adhesive tape from the front face of the semiconductor wafer.

In this method according to the present invention, a semiconductor wafer is subjected to back grinding so as to have a thickness of several tens of micrometers. Such semiconductor wafer is reinforced with an annular convex portion formed at an outer periphery of a back face thereof. Accordingly, it is possible to prevent the semiconductor wafer from being disadvantageously bent or warped in handling or another processing.

In a case that a separating adhesive tape is to be joined to a protective tape joined to a front face of the semiconductor wafer, fluid is supplied into a space defined inside the semiconductor wafer, so that a pressure in the space is appropriately increased. Also in this state, the locking member supports the outer periphery of the annular convex portion so as to come into contact with the outer periphery of the annular convex portion; thus, the wafer is tightly secured to the holding table. As a result, it is possible to prevent the fluid from being leaked from an interface between the holding table and the wafer. This is particularly effective in a case that the annular convex portion has a narrow width or in a case that a flat front face of the wafer cannot be suction held. In other words, the adhesive tape can be joined to, with good accuracy, the wafer which is reinforced with the annular convex portion and has an uneven thickness due to the formation of the irregularities on the back face thereof.

Further, the guide member guides the joined adhesive tape in the reverse direction; thus, the protective tape integrated with the adhesive tape is separated from the front face of the wafer. Also in this case, the semiconductor wafer is reinforced with the annular convex portion formed along the outer periphery of the back face thereof. Therefore, the semiconductor wafer is prevented from being damaged due to adhesion of the protective tape.

In this method, preferably, the guide member is used as the joining member so that the joining of the adhesive tape to the protective tape and the separation of the protective tape from the semiconductor wafer are performed simultaneously.

With this configuration, the guide member joins the adhesive tape to the surface of the protective tape while pressing the adhesive tape against the surface of the protective tape and, simultaneously, guides the adhesive tape in the reverse direction to separate the protective tape integrated with the adhesive tape from the front face of the semiconductor wafer. Thus, the joining of the adhesive tape to the protective tape and the separation of the protective tape from the semiconductor wafer can be performed simultaneously. This leads to reduction in processing time and simplification in configuration of an apparatus unlike a case that joining of an adhesive tape using a joining member and separation of the adhesive tape using a guide member are performed independently.

For example, the guide member to be used herein is made of a plate material having an edge. In this case, the adhesive tape integrated with the protective tape is folded back at a steep angle by the edge of the guide member. Therefore, an angle that the tape is separated from the semiconductor wafer is considerably larger than an angle in a case that a roller guides the tape in a reverse direction. Thus, an orthogonal component acted on the front face of the semiconductor wafer by a separating force generated at a separation point between the front face of the semiconductor wafer and the protective tape becomes small. As a result, even when the adhesion of the protective tape is not sufficiently lowered, the protective tape can be readily and smoothly separated from the semiconductor wafer without a large separating force to be applied to the semiconductor wafer.

In this method, preferably, the fluid is supplied into the space while an outflow of the fluid from the space is permitted, so that a pressure in the space is increased. For example, a fine hole formed on the holding table permits the outflow of the fluid.

With this configuration, when the internal pressure in the space defined between the back face of the semiconductor wafer and the holding table is increased, the semiconductor wafer is deformed so as to slightly swell upward. That is, when the joining member is pressed against the semiconductor wafer from above, the semiconductor wafer is flattened. When the semiconductor wafer is flattened and then the space is reduced in volume as compared with the time when the semiconductor wafer swells upward, the internal air is discharged from the space, so that an increase in inner pressure is suppressed.

In this method, preferably, the joining member moves slowly at an adhesive tape joining start position. Also preferably, a pressing force of the joining member to be applied to the annular convex portion corresponding to the adhesive tape joining start position is larger than a pressing force of the joining member to be applied to the flat concave portion formed inside the annular convex portion. With this configuration, the adhesive tape can be brought into close contact with the protective tape.

In order to accomplish the aforementioned object, the present invention also adopts the following configuration:

An apparatus for joining a separating adhesive tape to a protective tape joined to a front face of a semiconductor wafer, the apparatus comprising: a holding table for holding a semiconductor wafer, having a back face on which an annular convex portion is formed along an outer periphery so as to surround a back-ground area and a flat concave portion is formed at an inner-diameter side of the annular convex portion, so as to come into contact with the annular convex portion; a locking member for locking the outer periphery of the annular convex portion of the semiconductor wafer held by the holding table; fluid supply means for supplying fluid from a side of the holding table into a space defined between the back face of the semiconductor wafer and the holding table; tape supply means for supplying a separating adhesive tape toward a surface of a protective tape joined to the semiconductor wafer; and a tape joining unit allowing a joining member, which has a width larger than an outer diameter of the semiconductor wafer, to move from a first end to a second end of the semiconductor wafer such that the joining member presses a non-adhesive surface of the adhesive tape against the surface of the protective tape, for joining the adhesive tape to the surface of the protective tape.

With this configuration, it is possible to suitably realize the aforementioned adhesive tape joining method.

Herein, examples of the locking member may include: locking pins provided in a pair of clamp members disposed so as to be opposite to each other with the semiconductor wafer interposed therebetween and moved so as to approach each other or so as to be spaced away from each other; and a pair of locking members each having a "V"-shaped recess, the locking members being disposed so as to be opposite to each other with the semiconductor wafer interposed therebetween and moved so as to approach each other or so as to be spaced away from each other.

In order to accomplish the aforementioned object, the present invention also adopts the following configuration:

An apparatus for separating from a semiconductor wafer a protective tape joined to a front face of the semiconductor wafer, the apparatus comprising: a holding table for holding the semiconductor wafer, having a back face on which an annular convex portion is formed along an outer periphery so as to surround a back-ground area and a flat concave portion is formed at an inner-diameter side of the annular convex portion, so as to come into contact with the annular convex portion; a locking member for locking the outer periphery of the annular convex portion of the semiconductor wafer held by the holding table; fluid supply means for supplying fluid from a side of the holding table into a space defined between the back face of the semiconductor wafer and the holding table; tape supply means for supplying a separating adhesive tape toward a surface of a protective tape joined to the semiconductor wafer; a tape joining unit allowing a joining member, which has a width larger than an outer diameter of the semiconductor wafer, to move from a first end to a second end of the semiconductor wafer such that the joining member presses a non-adhesive surface of the adhesive tape against the surface of the protective tape, for joining the adhesive tape to the surface of the protective tape; and separation means allowing a guide member, which moves from the first end to the second end of the semiconductor wafer, to guide the joined separating adhesive tape in a reverse direction, for separating the protective tape integrated with the adhesive tape from the front face of the semiconductor wafer.

With this configuration, it is possible to suitably realize the aforementioned protective tape separating method.

Herein, examples of the locking member may include: locking pins provided in a pair of clamp members disposed so as to be opposite to each other with the semiconductor wafer interposed therebetween and moved so as to approach each other or so as to be spaced away from each other; and a pair of locking members each having a "V"-shaped recess, the locking members being disposed so as to be opposite to each other with the semiconductor wafer interposed therebetween and moved so as to approach each other or so as to be spaced away from each other.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DESCRIPTION OF THE PREFERRED EMBODIMENTS

With reference to FIGS. 1 to 17, hereinafter, description will be given of an apparatus according to a first embodiment of the present invention, that is, an apparatus capable of realizing a method for joining an adhesive tape to a semiconductor wafer and a method for separating a protective tape from the semiconductor wafer.

Figure 1:
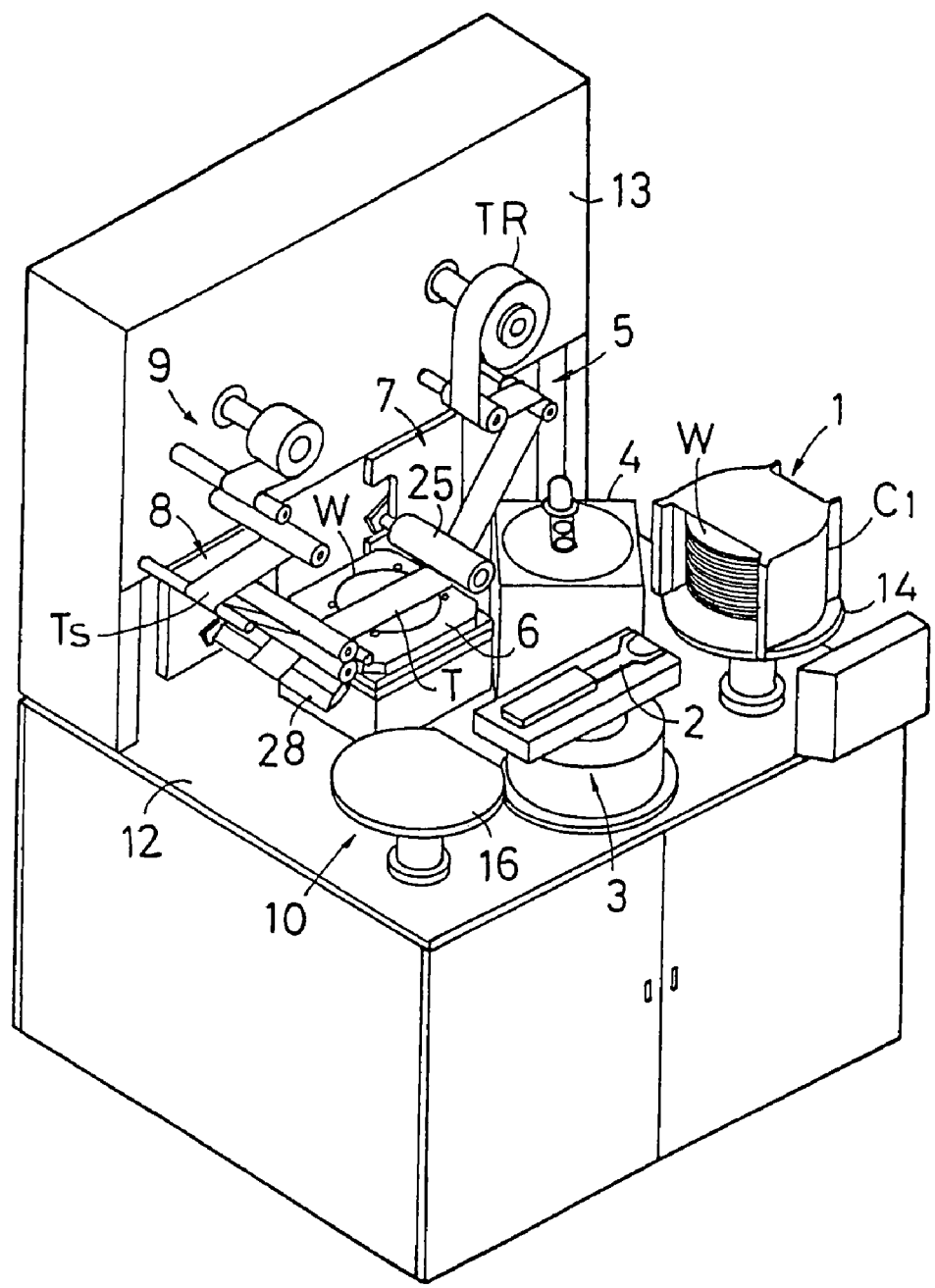
FIG. 1 is a perspective view illustrating a general configuration of a protective tape separation apparatus according to a first embodiment of the present invention.
Figure 2:
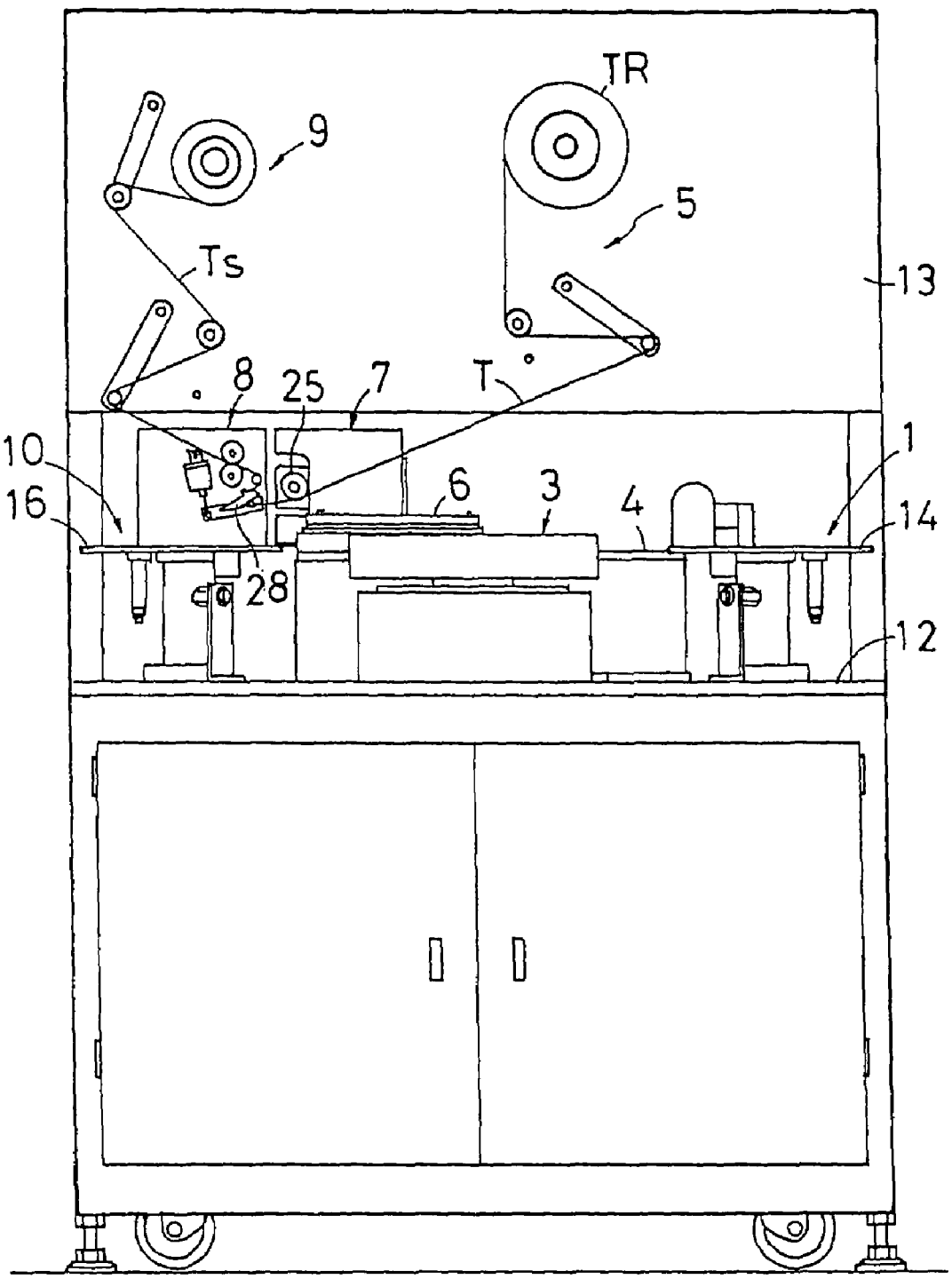
FIG. 2 is a front view illustrating the general configuration of the protective tape separation apparatus.
Figure 3:
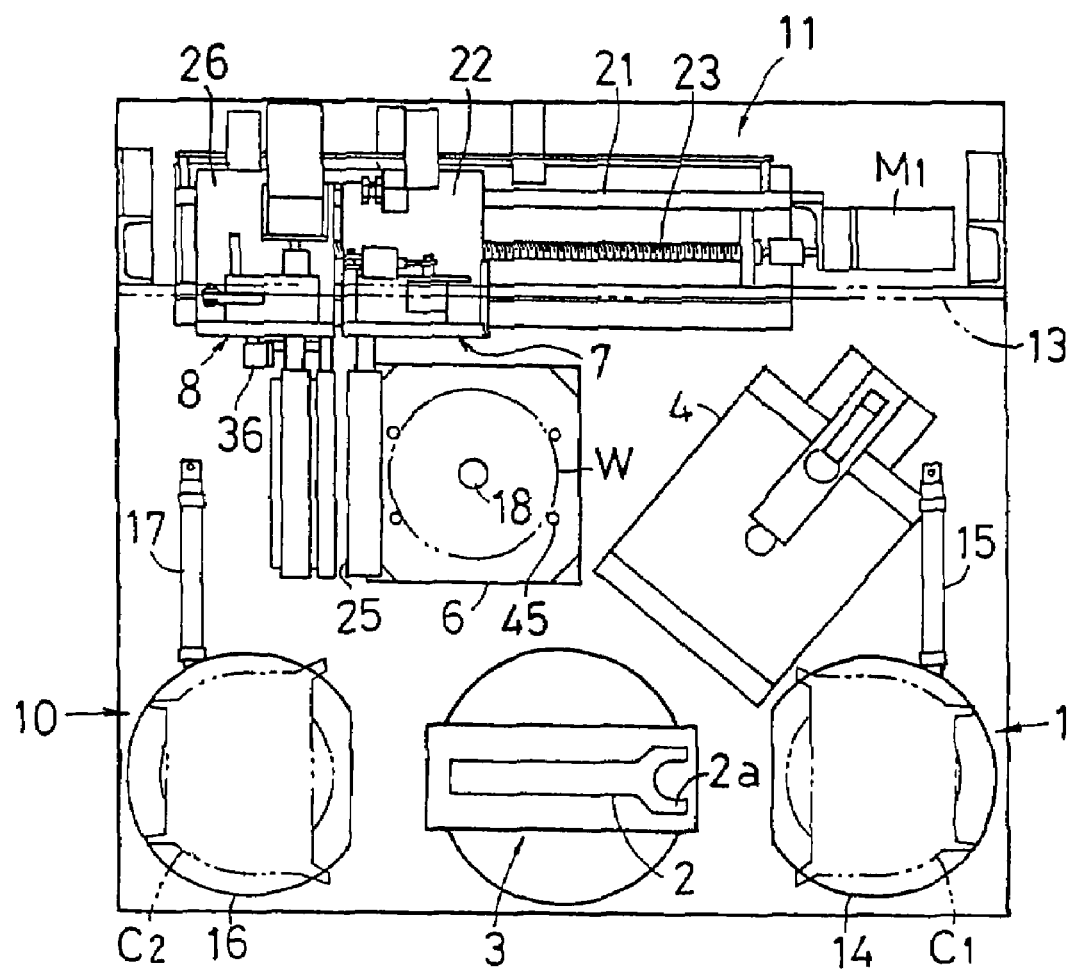
FIG. 3 is a plan view illustrating the general configuration of the protective tape separation apparatus.

FIG. 1 is a perspective view illustrating a general configuration of an apparatus for separating a protective tape from a semiconductor wafer as one example of the apparatus executing the method according to the present invention. FIG. 2 is a front view illustrating the general configuration of the apparatus. FIG. 3 is a plan view illustrating the general configuration of the apparatus.

In the adhesive tape joining/separation apparatus, a wafer supply section 1, a wafer transport mechanism 3, an alignment stage 4, a tape supply section 5, a holding table 6, a tape joining unit 7, a tape separation unit 8, a tape collection section 9, a wafer collection section 10, a unit driving section 11 and the like are provided on a base 12. The wafer supply section 1 includes a cassette C1 for housing wafers W, each of which has been subjected to a back grinding process, in a stacked manner. The wafer transport mechanism 3 is equipped with a robot arm 2. The alignment stage 4 performs alignment on the wafer W. The tape supply section 5 supplies a separating adhesive tape T toward a site where a separating process is performed. The holding table 6 suction holds the wafer W. The tape joining unit 7 joins the adhesive tape T to the wafer W on the holding table 6. The tape separation unit 8 separates the joined adhesive tape T. The tape collection section 9 reels and collects the adhesive tape Ts subjected to the separating process. The wafer collection section 10 includes a cassette C2 for housing the wafers W, each of which has been subjected to the separating process, in a stacked manner. The unit driving section 11 allows the tape joining unit 7 and the tape separation unit 8 to independently reciprocate laterally.

Herein, the wafer supply section 1, the wafer transport mechanism 3, the alignment stage 4, the holding table 6 and the wafer collection section 10 are disposed at a top side of the base 12. The tape supply section 5 and the tape collection section 9 are disposed at a front side of a vertical wall 13 which is provided upright on the top side of the base 12. The tape joining unit 7 and the tape separation unit 8 are directed to an opening formed below the vertical wall 13. The unit driving section 11 is disposed at a rear side of the vertical wall 13.

In the wafer supply section 1, wafers W in a horizontal posture are inserted into and housed in the cassette C1 with an appropriate clearance vertically interposed therebetween in a state that a front face of each wafer W, to which an ultraviolet-ray curable protective tape PT is joined, is directed upward. The cassette C1 is mounted on a cassette bench 14 with the wafers W inserted thereinto and housed therein. As illustrated in FIG. 3, the cassette bench 14 is turnable by an air cylinder 15 such that a direction thereof is changed.

In the wafer collection section 10, similarly, wafers W in a horizontal posture are inserted into and housed in the cassette C2 with an appropriate clearance vertically interposed therebetween in a state that a protective tape PT is separated from each wafer W, and the cassette C2 is mounted on a cassette bench 16 with the wafers W inserted thereinto and housed therein. The cassette bench 16 is also turnable by an air cylinder 17 such that a direction thereof is changed. Herein, the wafer W is irradiated with ultraviolet rays before being housed in the cassette C1 such that an adhesive surface of the protective tape PT is lowered in adhesion.

Figure 7:
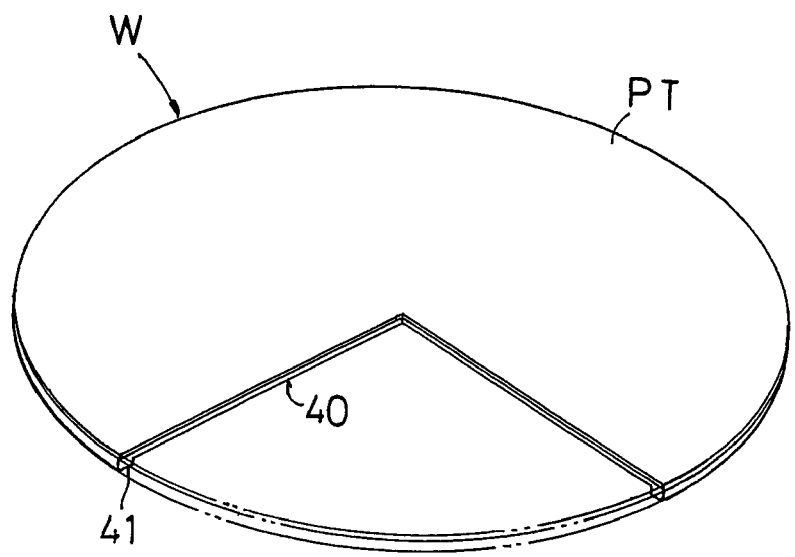
FIG. 7 is a partially-cutout perspective view illustrating a front face of a semiconductor wafer.
Figure 8:
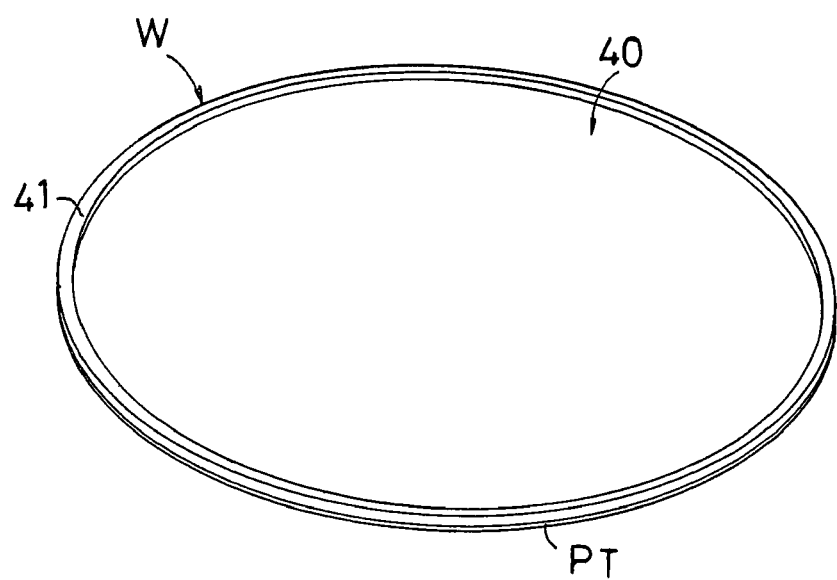
FIG. 8 is a perspective view illustrating a back face of the semiconductor wafer.
Figure 9:
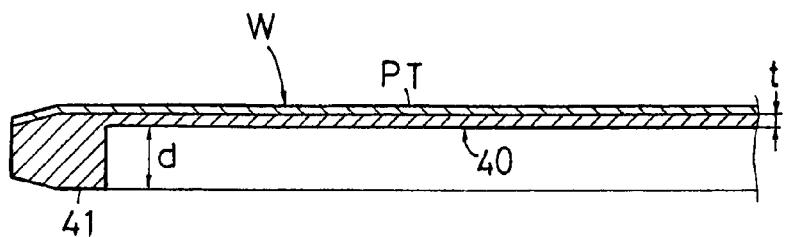
FIG. 9 is a partially-enlarged vertical sectional view illustrating the semiconductor wafer.

A wafer W which is a subject to be processed is subjected to a back grinding process in a state that a protective tape PT is joined to a front face (a face on which a pattern is formed) thereof as illustrated in FIG. 7 which is a perspective view illustrating the front face of the wafer W, FIG. 8 which is a perspective view illustrating a back face of the wafer W and FIG. 9 which is a sectional view illustrating the wafer W. The back face of the wafer W is ground such that an outer periphery is higher than a ground area by about 2 mm in a radial direction. More specifically, a flat concave portion 40 is formed on the back face and an annular convex portion 41 is left along the outer periphery of the back face.

Herein, the flat concave portion 40 has a depth d of several hundreds of micrometers and a thickness t of several tens of micrometers, for example. That is, the annular convex portion 41 formed at the outer periphery of the back face functions as an annular rib for enhancing rigidity of the wafer W. Accordingly, the annular convex portion 41 hinders the wafer W from being warped in handling or another processing.

As illustrated in FIG. 3, the robot arm 2 of the transport mechanism 3 is advanceable/retreatable horizontally, is turnable and is movable vertically. The robot arm 2 has a tip end provided with a suction holding part 2a formed into a horseshoe shape. The robot arm 2 takes a wafer W out of the wafer supply section 1, supplies the wafer W to the alignment stage 4, transports the wafer W from the alignment stage 4 to the holding table 6, carries the processed wafer W out of the holding table 6, and carries the processed wafer W in the wafer collection section 10.

The tape supply section 5 guides a separating adhesive tape T, which is unreeled from an original tape roll TR, toward the tape joining unit 7 and the tape separation unit 8 via a position above the holding table 6. A width of the adhesive tape T to be used herein is smaller than a diameter of a wafer W.

Figure 10:
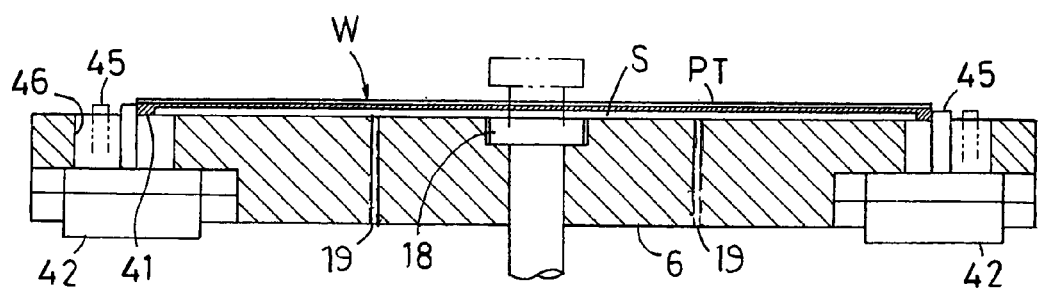
FIG. 10 is a vertical sectional view illustrating a state that a wafer is placed on a holding table.

As illustrated in FIG. 10, a suction pad 18 for giving or receiving a wafer W is provided at a center of a top side of the holding table 6 for holding the wafer W placed thereon in separation of a protective tape, so as to protrude from or retreat into the holding table 6. Further, a pair of front and rear clamp members 42 are attached to the holding table 6 so as to be slidable in a forward/rearward direction.

In the suction pad 18, when a vacuum pump (not illustrated) communicated with and connected to the suction pad 18 at an upstream side is operated so as to generate a positive pressure, air is supplied via a channel 19 to a space S defined between the holding table 6 and the annular convex portion 41 of the wafer W. Thus, the space S is applied with a predetermined pressure which is slightly higher than an atmospheric pressure. Moreover, the holding table 6 is provided with a fine hole (not illustrated) which permits internal air with appropriate resistance to flow externally from the space S when the space S is applied with the pressure.

Figure 11:
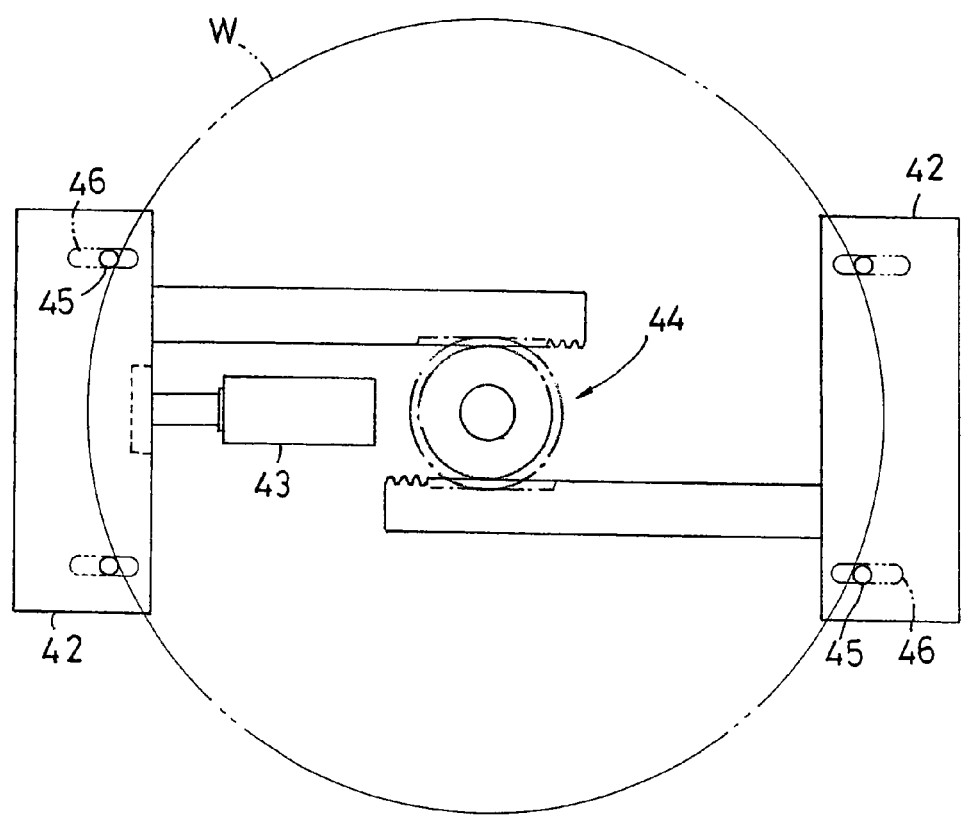
FIG. 11 is a plan view illustrating a locking member driving structure.

As illustrated in FIG. 11, the first clamp member 42 is driven by an air cylinder 43 so as to slide in the forward/rearward direction. The second clamp member 42 is interlocked with the first clamp member 42 through a rack and pinion type anticlastic moving mechanism 44. More specifically, the clamp members 42 are moved so as to approach each other or so as to be spaced away from each other in synchronization with an expansion/contraction operation of the air cylinder 43. Further, each clamp member 42 includes a pair of locking pins 45 provided at a right side and a left side thereof. Each locking pin 45 protrudes from the holding table 6 so as to be lower than a thickness of a wafer W, through a longitudinally oval hole 46 formed on the holding table 6. It is to be noted that the locking pin 45 corresponds to a locking member according to the present invention.

Figure 4:
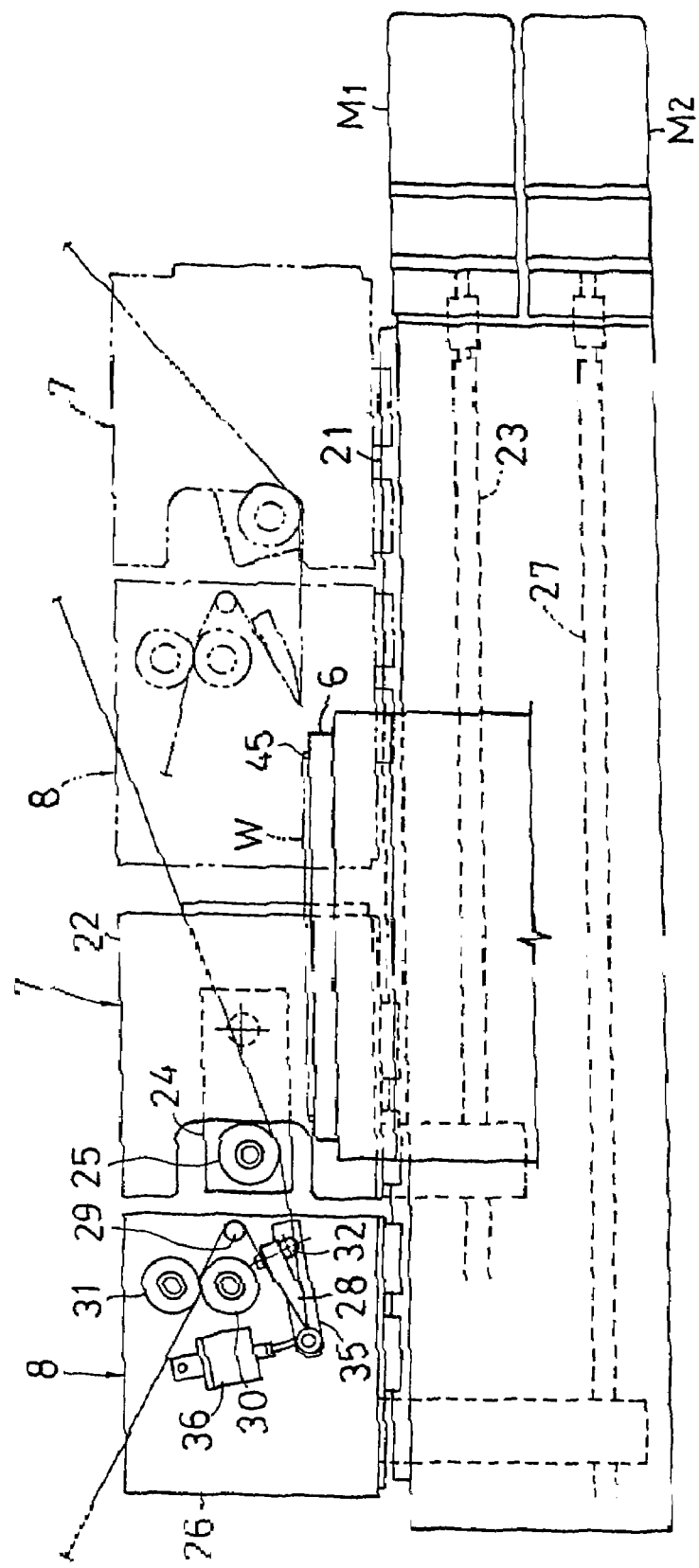
FIG. 4 is a front view illustrating a tape joining unit and a tape separation unit.

As illustrated in FIG. 4, the tape joining unit 7 has the following structure. That is, a movable bench 22 is supported on a rail 21 so as to move laterally along the rail 21, and is allowed to reciprocate laterally and horizontally at a fixed stroke through a feed screw 23 which is driven by a motor M1 in a forward/backward direction. Further, the movable bench 22 is equipped with a joining roller 25 which is movable vertically through an oscillation arm 24. A width of the joining roller 25 to be used herein is larger than an outer diameter of a wafer W. It is to be noted that the joining roller 25 corresponds to a joining member according to the present invention.

On the other hand, the tape separation unit 8 has the following structure. That is, a movable bench 26 is supported on the rail 21 so as to move laterally along the rail 21, and is allowed to reciprocate laterally and horizontally at a fixed stroke through a feed screw 27 which is driven by a motor M2 in a forward/backward direction. The movable bench 26 is equipped with a tape separating guide member 28, a guide roller 29, a feed roller 30 which is rotatably driven, and a nip roller 31 which is opposite to the feed roller 30.

Figure 5:
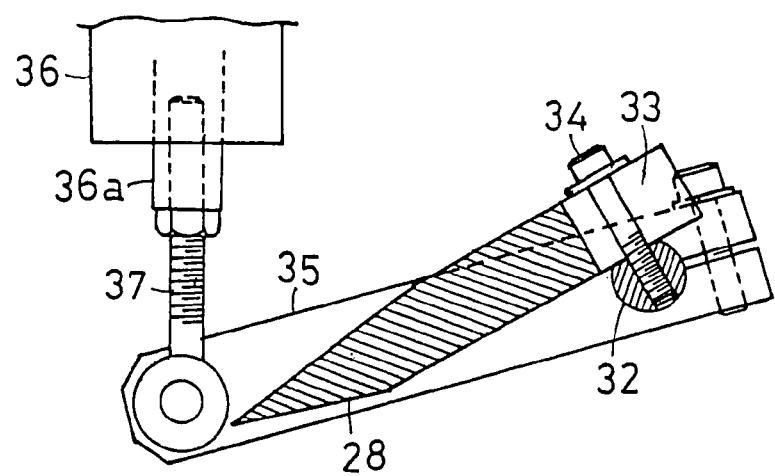
FIG. 5 is a front view illustrating a support structure of a tape separating edge member.
Figure 6:
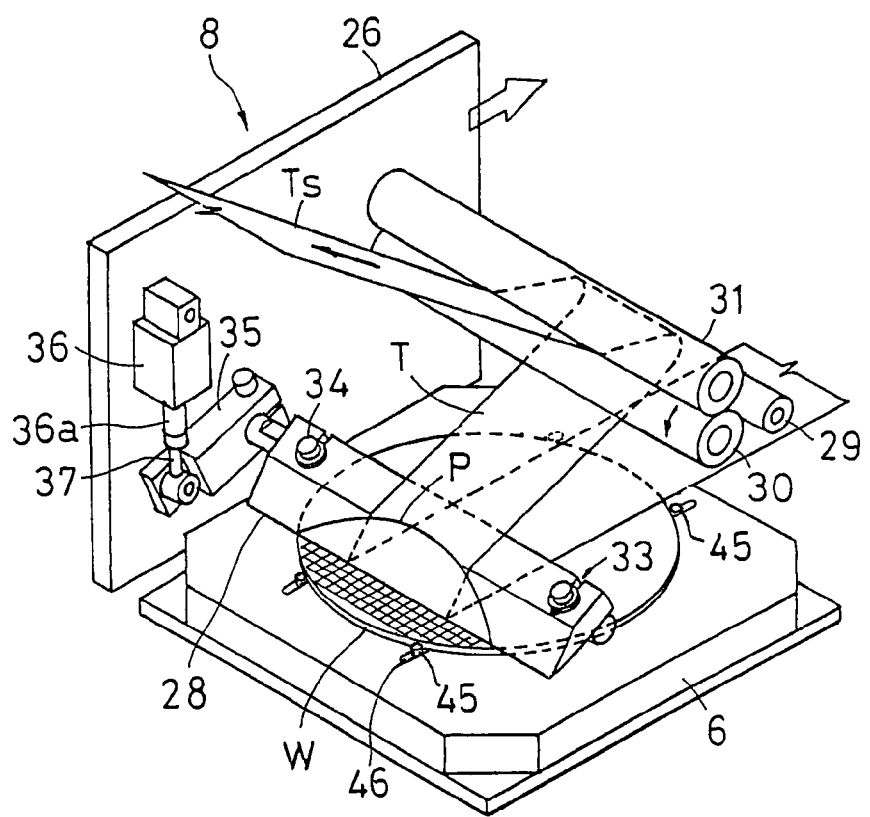
FIG. 6 is a perspective view illustrating statuses of main components upon performance of a tape separating operation.

As illustrated in FIGS. 5 and 6, the tape separating guide member 28 is formed into a plate shape. Herein, a tip end of the guide member 28 is formed into a sharp edge, and a width of the guide member 28 is larger than an outer diameter of a wafer W. Moreover, the guide member 28 is fixedly coupled to a rotational support shaft 32 through a slit 33 and a bolt 34 such that advancement or retreat of the guide member 28 is adjustable. The rotational support shaft 32 is rotatably supported at the front side of the movable bench 26. Moreover, an operating arm 35 is fastened to and coupled to a base end of the rotational support shaft 32. Further, a coupling rod 37 is pivotally supported on and coupled to a free end of the operating arm 35, and is coupled to an air cylinder 36 which is attached to the front side of the movable bench 26. The rotational support shaft 32 is rotated by oscillation of the operating arm 35 caused by advancement or retreat of the air cylinder 36. With this operation, the tip end edge of the guide member 28 moves upward/downward.

In addition, a coupling rod 37 is extended from the free end of the operating arm 35, and is screwed into and attached to a piston rod 36a of the air cylinder 36. By adjustment of a screwed amount of the coupling rod 37, it is possible to adjust an oscillation angle of the operating arm 35 when the piston rod 36a protrudes to its stroke end. In other words, it is possible to optionally adjust an angle of the edge member 28 located at a lower limit position.

The respective components of the adhesive tape joining/separation apparatus according to the present invention are configured as described above. With reference to FIGS. 10 to 16, next, description will be given of basic steps of joining a separating adhesive tape T to a protective tape PT joined to a front face of a wafer W; and separating the protective tape PT from the front face of the wafer W.

First, the robot arm 2 is inserted into the cassette C1 of the wafer supply section 1, suction holds a back face of a predetermined wafer W, takes the wafer W out of the cassette C1, and transfers the wafer W to the alignment stage 4. The alignment stage 4 performs alignment on the wafer W on the basis of detection of a detection site such as a notch previously formed at an outer periphery of the wafer W. After completion of the alignment, the robot arm 2 suction holds the back face of the wafer W again, and transports the wafer W to the holding table 6 which moves downward to a wafer reception level on standby.

As illustrated in FIG. 10, when the wafer W is transported to the holding table 6, the suction pad 18 protrudes from the holding table 6 to receive the wafer W. Then, the suction pad 18 moves downward, so that the wafer W is placed on the holding table 6. Herein, the clamp members 42 illustrated in FIG. 11 are situated on standby at positions which are opposite to each other with a predetermined clearance interposed therebetween, and the wafer W is placed on the clearance between the front and rear locking pines 45.

When the wafer W is placed on the holding table 6, the both clamp members 42 move so as to approach each other. Herein, the locking pins 45 of each clamp member 42 come into contact with the outer periphery of the wafer W, so that predetermined clamping forces are applied to the wafer W at the center of the holding table 6 from left and right sides. Thus, the locking pins 45 lock and secure the wafer W.

When the wafer W is locked and secured on the holding table 6, the vacuum pump operates so as to generate a positive pressure; thus, air is supplied into a space S defined between the wafer W and the holding table 6. Thus, the space S is applied with a predetermined pressure which is slightly higher than an atmospheric pressure.

Figure 12:
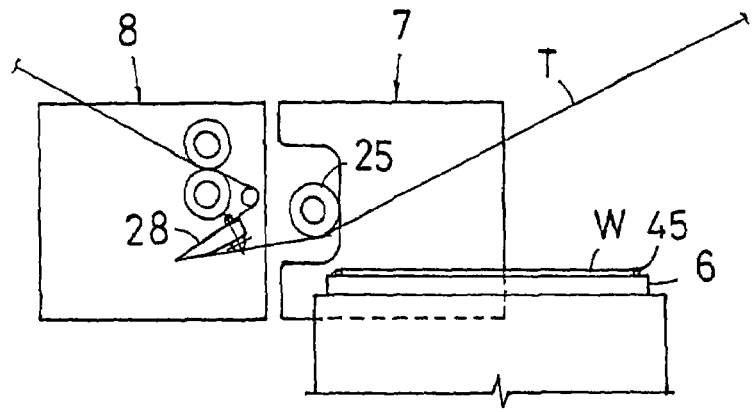
FIGS. 12 to 16 are front views each illustrating a tape separating step.

As illustrated in FIG. 12, at a point in time when the wafer W is transported to the holding table 6, the tape joining unit 7 and the tape separation unit 8 are situated at standby positions, respectively, which are spaced away from the holding table 6 in a rearward direction.

Figure 13:
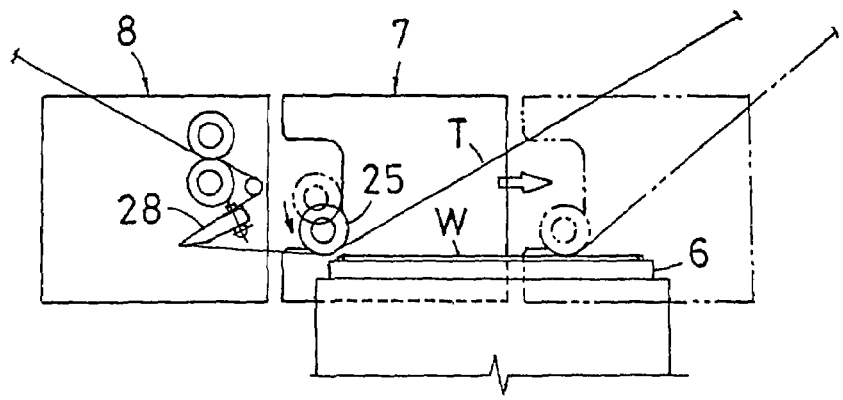

As illustrated in FIG. 13, when the wafer W is transported to the holding table 6, the joining roller 25 of the tape joining unit 7 moves downward to a predetermined joining level. Thereafter, the tape joining unit 7 moves forward as a whole, and the joining roller 25 rolls on the front face of the wafer W. As a result, an adhesive tape T is joined to a surface of a protective tape PT.

Herein, the width of the joining roller 25 to be used herein is larger than an outer diameter of the wafer W. Therefore, a force that the joining roller 25 presses the wafer W placed on the holding table 6 is restricted by the outer periphery of the back face of the wafer W. Accordingly, the thin portion of the wafer W pressed from above is prevented from being deformed by the joining roller 25 so as to swell downward.

Figure 14:
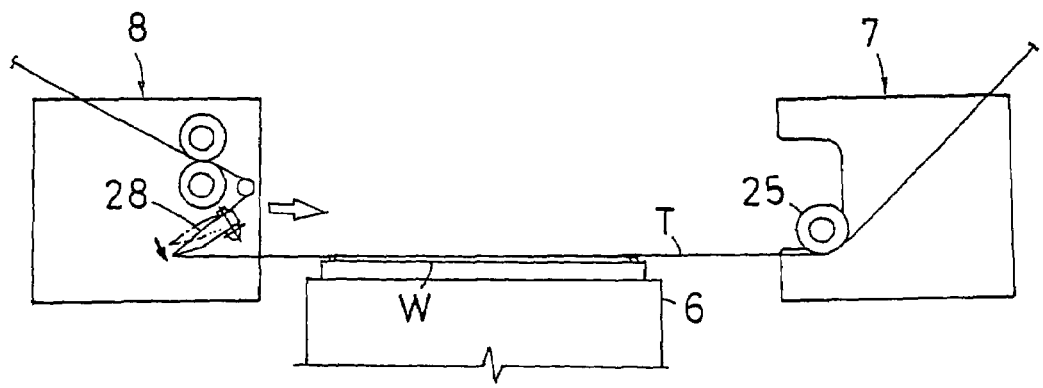

As illustrated in FIG. 14, after the joining of the adhesive tape T, in the tape separation unit 8, the air cylinder 36 protrudes to its stroke end and the guide member 28 moves downward to the lower limit position by the oscillation of the operating arm 35.

Figure 15:
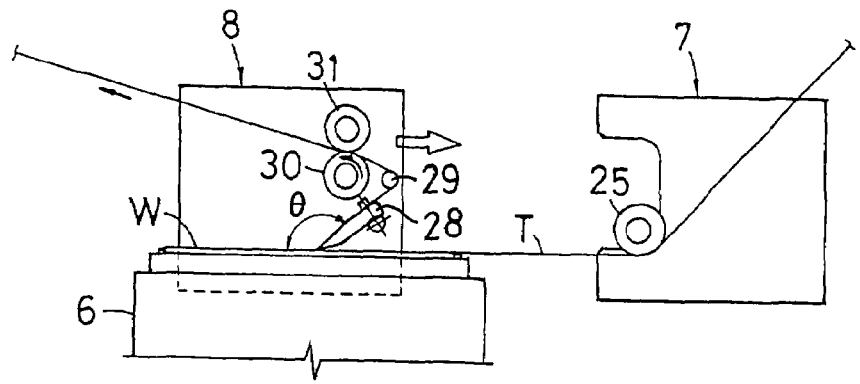

As illustrated in FIG. 15, next, when the tape separation unit 8 moves forward, the tip end of the guide member 28 moves while pressing the adhesive tape T against the surface of the protective PT and, also, the feed roller 30 feeds the adhesive tape T at a circumferential speed which is in synchronization with the moving speed of the guide member 28.

Figure 17:
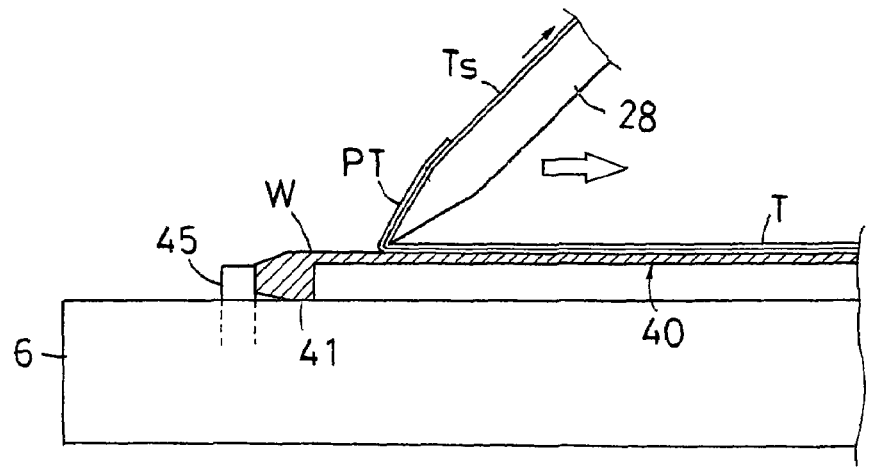
FIG. 17 is a vertical sectional view illustrating statuses of the main components upon performance of the tape separating operation.
Figure 18:
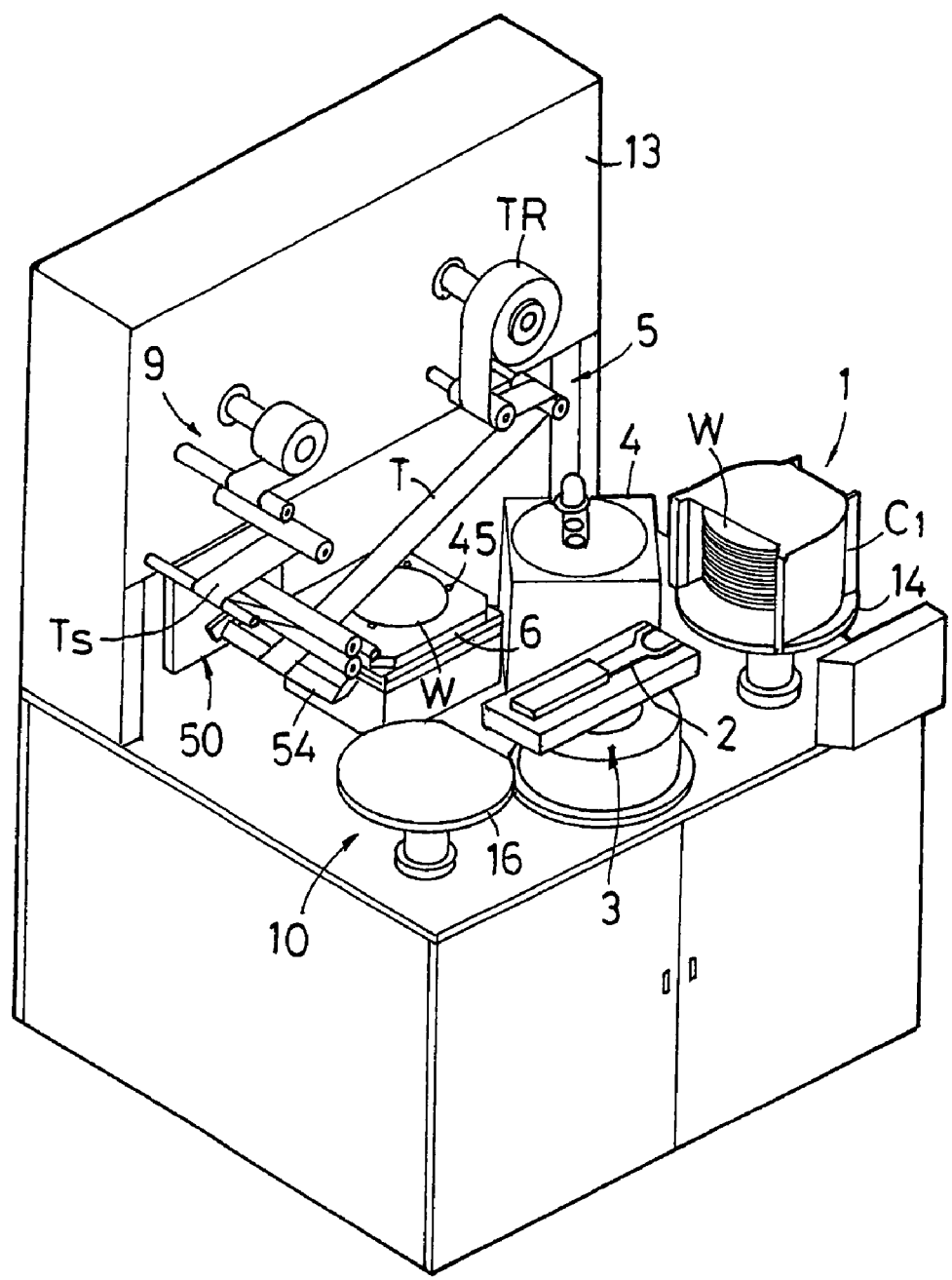
FIG. 18 is a perspective view illustrating a general configuration of a protective tape separation apparatus according to a second embodiment of the present invention.
Figure 19:
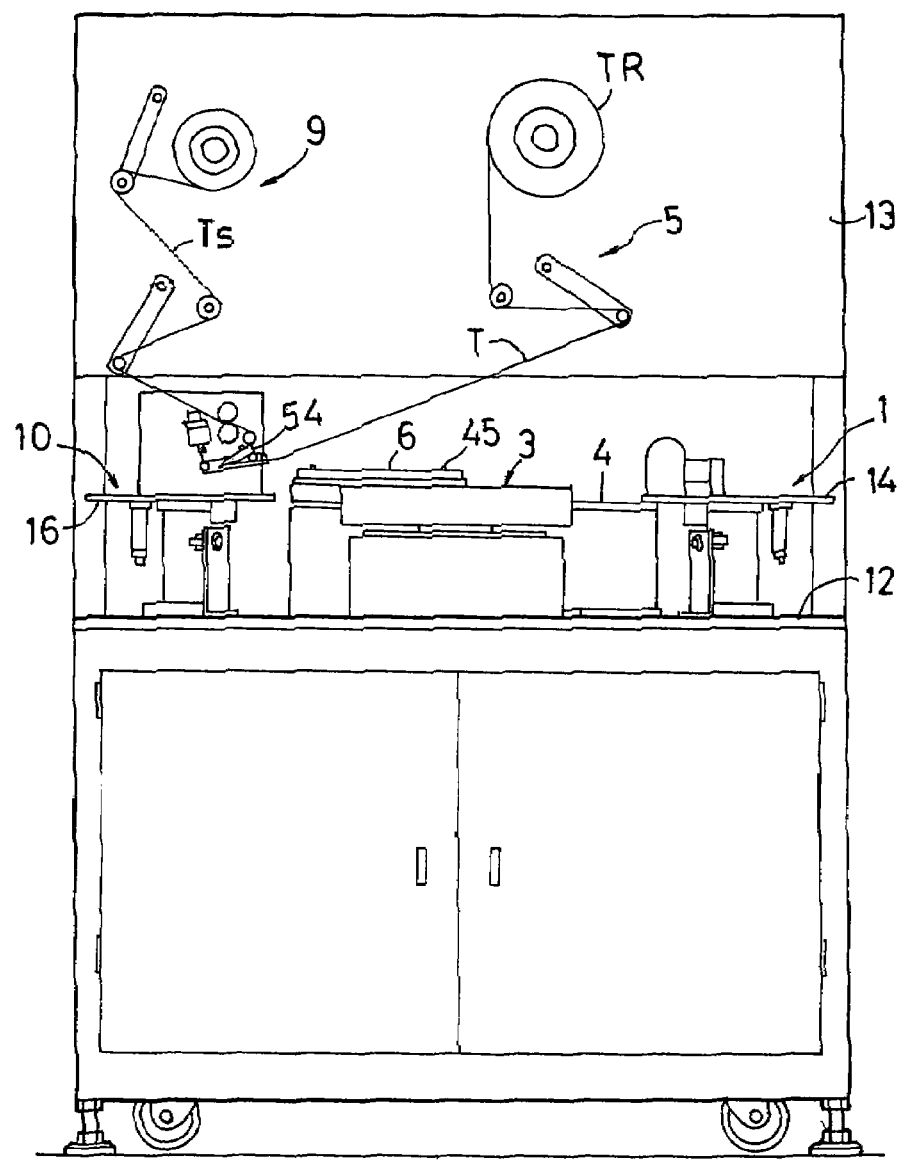
FIG. 19 is a front view illustrating the general configuration of the protective tape separation apparatus according to the second embodiment.
Figure 20:
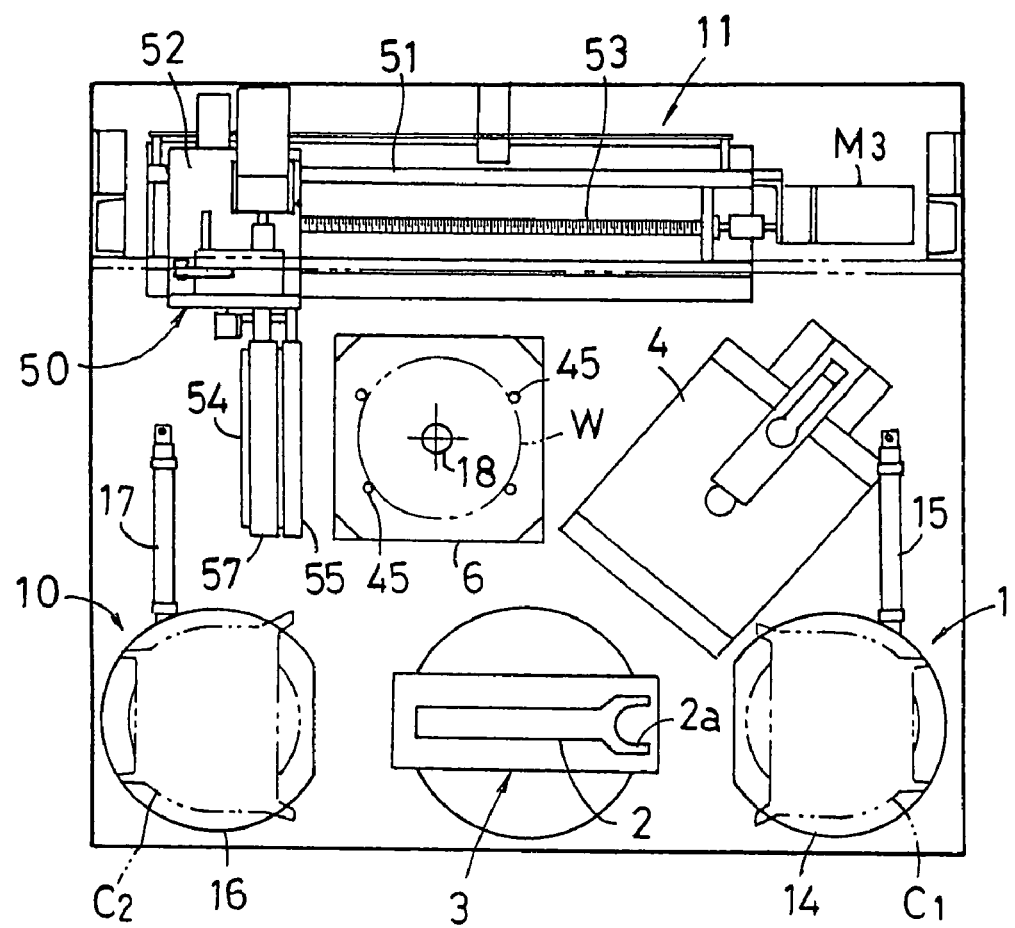
FIG. 20 is a plan view illustrating the general configuration of the protective tape separation apparatus according to the second embodiment.

Accordingly, the adhesive tape T is folded by the tip end of the guide member 28 in a reverse direction at a folding angle θ, and then is guided into between the feed roller 30 and the nip roller 31 through the guide roller 29. As illustrated in FIGS. 6 and 17, then, the adhesive tape T travels with the protective tape PT integrated therewith, so that the protective tape PT is separated from the front face of the wafer W.

Desirably, the folding angle θ of the adhesive tape T by the guide member 28 is set at a large angle, for example, 90° or more, preferably 100° or more. Alternatively, the aforementioned operation may be implemented by the folding angle θ of less than 90° (approximate to 90°) depending on conditions such as a viscosity of the adhesive tape T, an elasticity of the adhesive tape T and a strength of the wafer W. Desirably, the folding angle θ of the adhesive tape T is set to be smaller as the elasticity of the adhesive tape T is higher. This setting can be performed in such a manner that an angle of the guide member 28 situated at the lower limit position is adjusted by expansion/contraction of the coupling rod 37. Herein, a change in height of the guide member 28 in response to the change in angle of the guide member 28 can be corrected by adjustment of an attachment position of the guide member 28 to the rotational support shaft 32.

Preferably, a forward moving speed of the guide member 28 is made slow when the guide member 28 passes by the end of the wafer W to start separation of the protective tape PT and, thereafter, such forward moving speed is made fast. Such setting leads to improvement in processability. The feed roller 30 is rotatably driven by a driving device (not illustrated) through a slip clutch which idles by a load exceeding predetermined torque. Therefore, the feed roller 30 feeds the adhesive tape T while applying a predetermined tension to the adhesive tape T.

Figure 16:
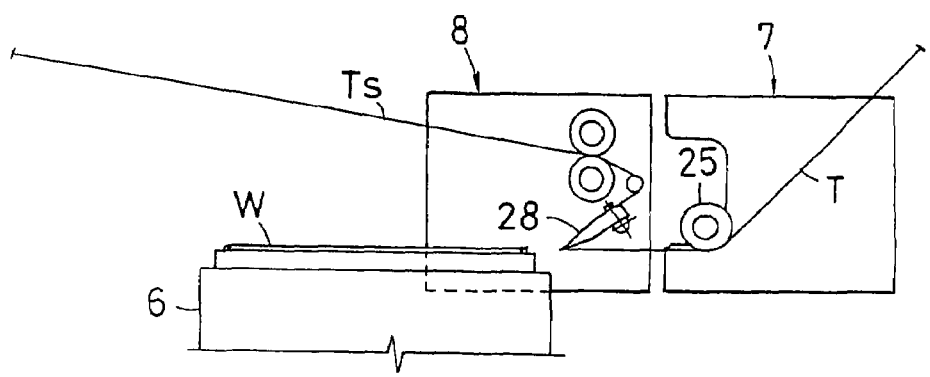

As illustrated in FIG. 16, when the tape separation unit 8 passes above the wafer W and the protective tape PT is completely separated from the front face of the wafer W, the clamp members 42 are moved so as to be spaced away from each other to release grasp of the outer periphery of the wafer W by the locking pins 45, and then the suction pad 18 lifts up the wafer W. Thereafter, the robot arm 2 transports the wafer W from the holding table 6 to the wafer collection section 10. Herein, the wafer W is inserted into and housed in the cassette C2. On the other hand, the tape joining unit 7 and the tape separation unit 8 return to the respective standby positions and, also, the tape collection section 9 reels and collects the adhesive tape Ts subjected to the separating process. In addition, the joining roller 25 and the guide member 28 move upward to standby positions, respectively.

Thus, a series of the separating adhesive tape joining step and the protective tape separating step is completed. Then, the adhesive tape joining/separation apparatus is ready for reception of a subsequent substrate.

FIGS. 18 to 26 illustrate an apparatus according to a second embodiment of the present invention, that is, an apparatus for separating a protective tape from a semiconductor wafer.

In this embodiment, joining of a separating adhesive tape T to a protective tape PT and separation of the protective tape PT from a wafer W are performed simultaneously. However, a basic configuration of the second embodiment is similar to that of the first embodiment. In the second embodiment, therefore, members and portions identical to those in the first embodiment are denoted by symbols identical to those in the first embodiment. Herein, description will be given of a structure different from that in the first embodiment.

Figure 21:
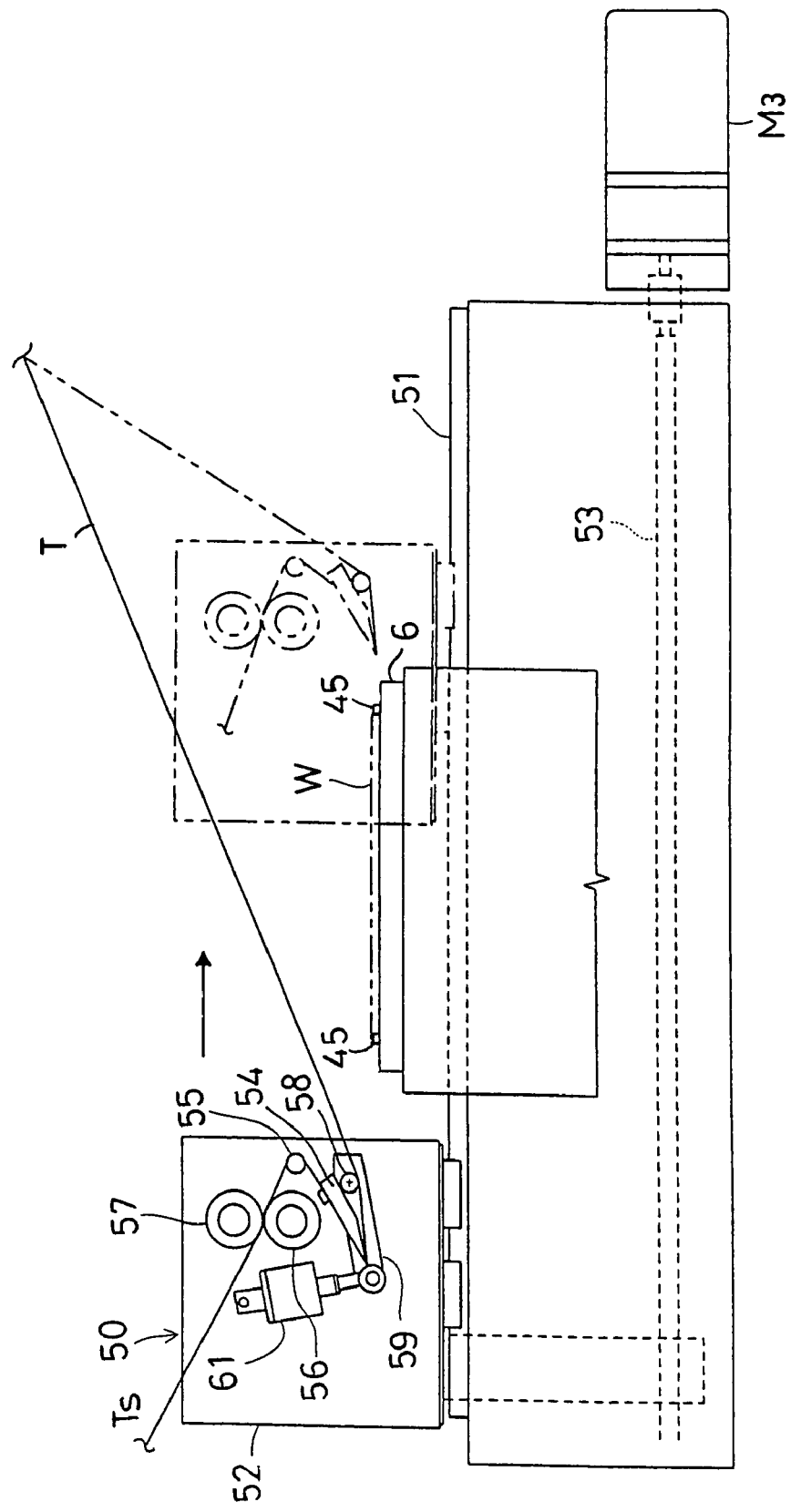
FIG. 21 is a front view illustrating a tape joining/separation unit in the second embodiment.

As illustrated in FIG. 21, a tape joining/separation unit 50 is provided in place of the tape joining unit 7 and the tape separation unit 8 in the first embodiment. The tape joining/separation unit 50 has the following structure. That is, a movable bench 52 is supported on a pair of front and rear rails 51 so as to slidably move laterally along the pair of rails 51, and is allowed to move laterally and horizontally through a feed screw 53 which is driven by a motor M3 in a forward/backward direction. The movable bench 52 is equipped with a guide member 54 which also serves as a joining member, a guide roller 55, a feed roller 56 which is rotatably driven, and a nip roller 57 which is opposite to the feed roller 56.

The guide member 54 of the tape joining/separation unit 50 is formed into a plate shape. Herein, a tip end of the guide member 54 is formed into a sharp edge, and a width of the guide member 54 is larger than an outer diameter of a wafer W. Moreover, the guide member 54 is fixedly coupled to a rotational support shaft 58 which is rotatably supported at a front side of the movable bench 52 such that a forward/rearward position thereof is adjustable.

Moreover, an operating arm 59 is fastened to and coupled to a base end of the rotational support shaft 58. Further, a free end of the operating arm 59 is coupled to an air cylinder 61 which is attached to the front side of the movable bench 52. The rotational support shaft 58 is rotated by oscillation of the operating arm 59 caused by expansion/contraction of the air cylinder 61. With this operation, the tip end of the guide member 54 moves upward/downward.

With reference to FIGS. 22 to 26, next, description will be given of a basic step of separating a protective tape PT joined to a front face of a wafer W. In the second embodiment, operations until a wafer W is held on a holding table 6 are identical to those in the first embodiment. Therefore, description will be given of operations after the wafer W is held on the holding table 6.

Figure 22:
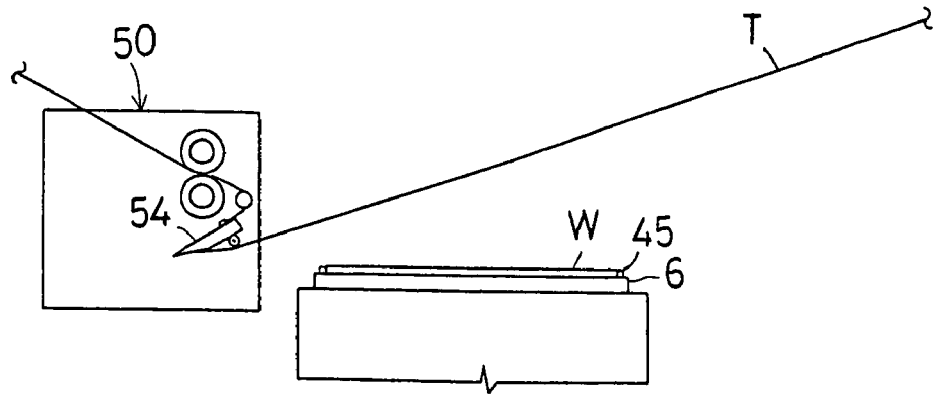
FIGS. 22 to 26 are front views each illustrating a tape separating step in the second embodiment.
Figure 23:
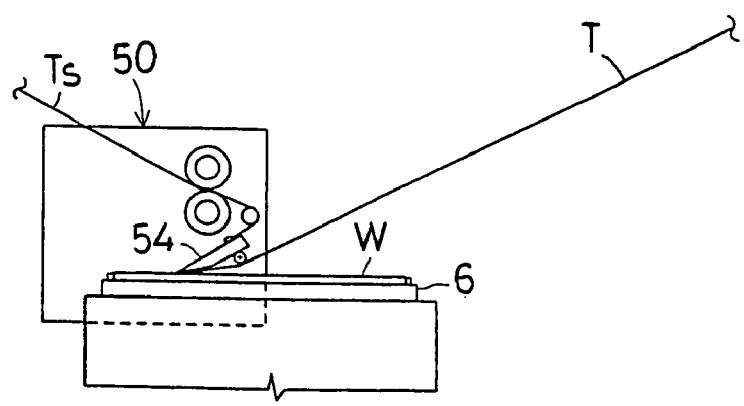

As illustrated in FIG. 22, first, the wafer W is held on the holding table 6, and then a space S defined between the wafer W and the holding table 6 is increased in internal pressure. As illustrated in FIG. 23, next, the tape joining/separation unit 50 moves forward to a position above the wafer W. More specifically, the tape joining/separation unit 50 moves forward such that the tip end of the guide member 54 reaches a forward point spaced away from a circumferential end of the wafer W on a standby position side by an appropriate distance. At this point, the air cylinder 61 protrudes to its stroke end, and the guide member 54 is allowed to move downward to a lower limit position by an operation of the operating arm 59. That is, the tip end of the guide member 54 comes into contact with a surface (non-adhesive surface) of an adhesive tape T, and then presses the adhesive tape T against a surface of a protective tape PT.

Figure 24:
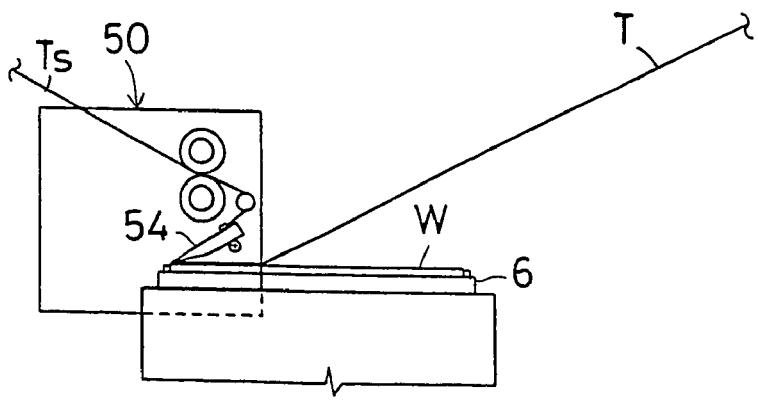

As illustrated in FIG. 24, when the guide member 54 moves downward, the tape joining/separation unit 50 moves rearward to its standby position. That is, the tip end of the guide member 54 joins the adhesive tape T to the surface of the protective tape PT while pressing the adhesive tape T against the protective tape PT.

Figure 25:
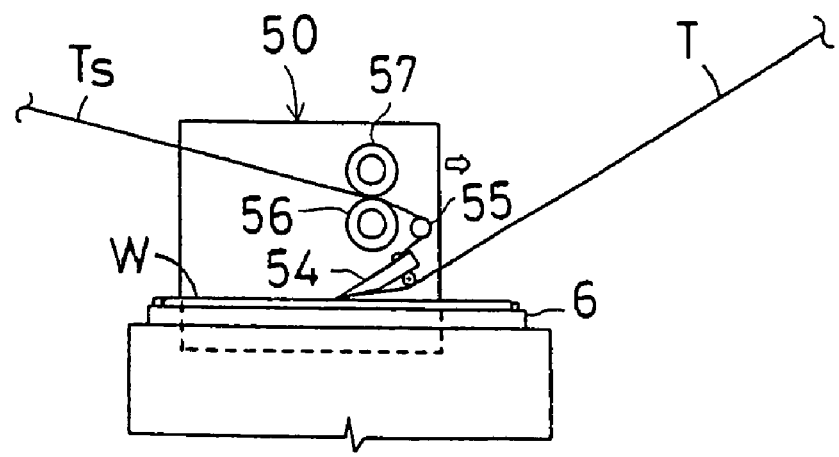

As illustrated in FIG. 25, when the tip end of the guide member 54 reaches the circumferential end of the wafer W, the tape joining/separation unit 50 moves forward in a reverse direction. Herein, the tip end of the guide member 54 moves while pressing the adhesive tape T against the surface of the protective tape PT, and the feed roller 56 reels the adhesive tape T at a circumferential speed which is in synchronization with the moving speed of the guide member 54. As described above, when the joining of the adhesive tape T and the separation of the adhesive tape T are performed simultaneously, the protective tape PT joined to and integrated with the adhesive tape T is separated from the front face of the wafer W together with the adhesive tape T.

Figure 26:
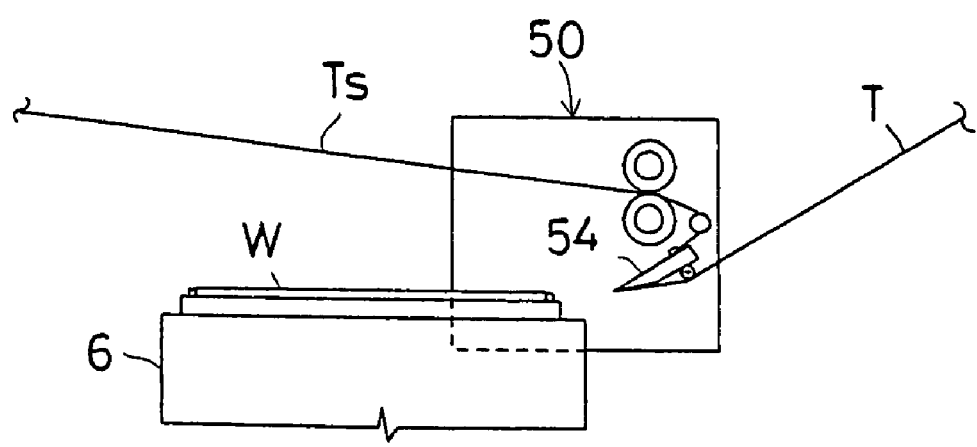

As illustrated in FIG. 26, when the tape joining/separation unit 50 passes by the wafer W and the protective tape PT is completely separated from the front face of the wafer W, a robot arm 2 transports the wafer W from the holding table 6 to a wafer collection section 10. Herein, the wafer W is inserted into and housed in a cassette C2. On the other hand, the tape joining/separation unit 50 returns to its standby position and, also, a tape collection section 9 reels and collects the adhesive tape Ts subjected to the separating process. In addition, the guide member 54 moves upward to its standby position.

Thus, a series of the protective tape separating steps is completed. Then, the adhesive tape joining/separation apparatus is ready for reception of a subsequent wafer.

The apparatus according to each of the aforementioned embodiments produces the following advantages. That is, even in a case of using a wafer W with surface irregularities, which has an annular convex portion 41 formed along an outer periphery of a back face so as to surround a back-ground area, when a separating adhesive tape T is joined to a protective tape PT joined to a front face of the wafer W, a space S defined inside the wafer W is pressurized appropriately with air supplied thereinto. Accordingly, even when the separating adhesive tape T is pressed by the joining roller 25 serving as a joining member or even when the separating adhesive tape T is pressed by the guide member 28 or 54 serving as a joining member, a joining force is prevented from being weakened due to disadvantageous deformation of the wafer W by the joining force. As a result, it is possible to join the adhesive tape T to the surface of the protective tape PT with good accuracy such that the adhesive tape T comes into close contact with the protective tape PT. Further, it is possible to separate the protective tape PT from the front face of the wafer W with good accuracy by the separation of the adhesive tape T joined to the protective tape PT.

Further, a width of the annular convex portion 41 coming into contact with the holding table 6 is small. Therefore, even when a suction force cannot withstand a pressure applied to the space S, the locking pins 45 come into contact with the outer periphery of the wafer W, thereby locking and securing the wafer W on the holding table 6 by left and right predetermined grasping forces. Therefore, it is possible to prevent the air from being leaked from the space S and to hold the wafer W. In addition, even when the thin portion of the wafer W is pressed from above, the wafer is prevented from being largely deformed so as to swell downward.

The present invention may be modified variously as follows.

(1) In each of the aforementioned embodiments, the guide member 28 or 54 for guiding the separating adhesive tape T in the reverse direction may be a roller with a small diameter.

Figure 27:
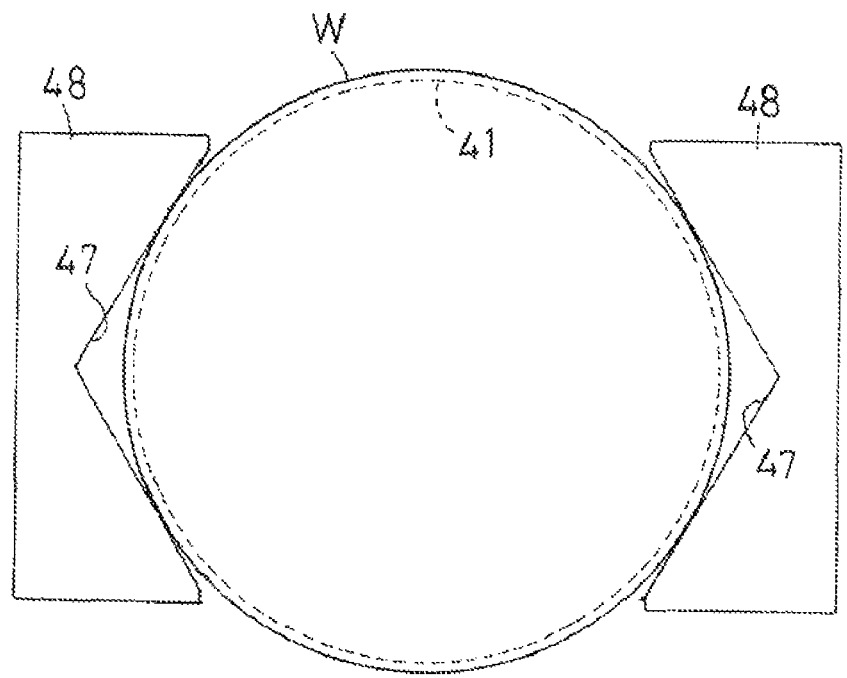
FIG. 27 is a plan view illustrating another embodiment of a wafer holding structure.

(2) In each of the aforementioned embodiments, as illustrated in FIG. 27, a pair of locking members 48 each having a "V"-shaped recess 47 are disposed so as to be opposite to each other, and are movable so as to approach each other or so as to be spaced away from each other. Herein, a height of each locking member 48 is lower than a front face of a wafer W. The opposing "V"-shaped recesses 47 may support an outer periphery of the wafer W so as to come into contact with the outer periphery of the wafer W.

Figure 28:
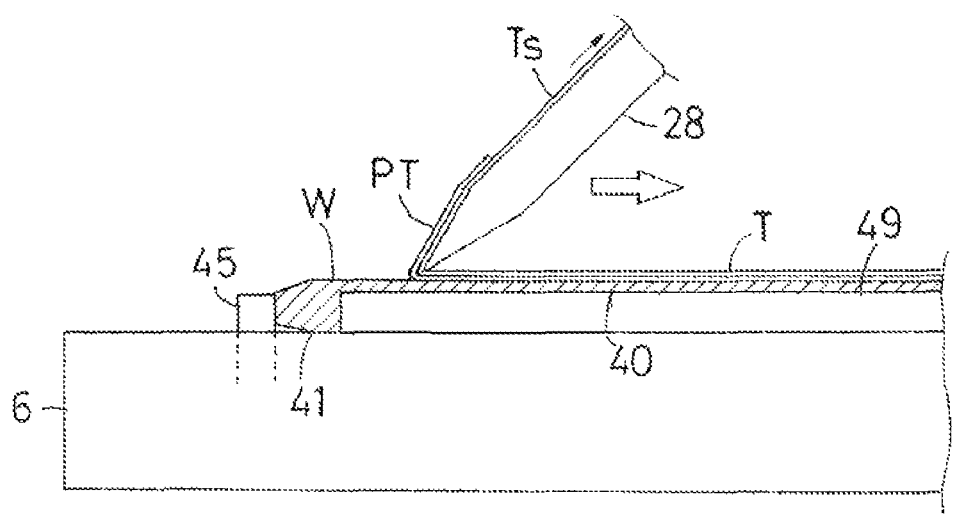
FIGS. 28 and 29 are vertical sectional views each illustrating main components of a holding table in the another embodiment.

(3) In each of the aforementioned embodiments, as illustrated in FIG. 28, a ridge 49 may be integrally formed on or attached to the top side of the holding table 6 so as to have a height which is equal to a depth d of a flat concave portion 40 formed on a back face of a wafer W by grinding. Further, the ridge 49 may be fitted into the flat concave portion 40 so as to receive most of the thin portion of the wafer W. Thus, it is possible to completely prevent the wafer W from swelling downward. As a result, it is possible to perform joining of an adhesive tape T with more certainty.

Figure 29:
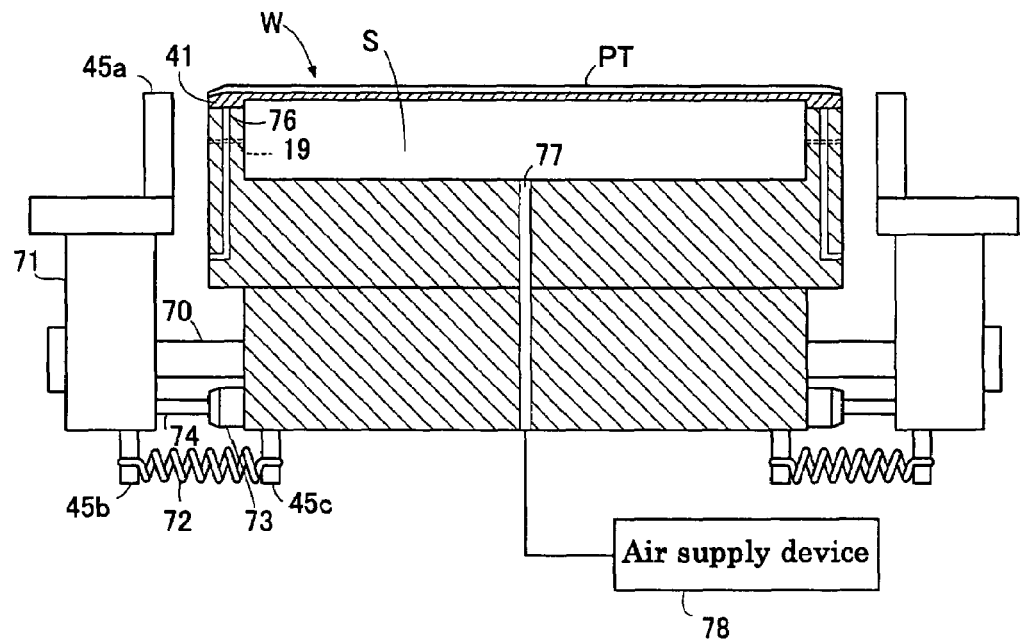
Figure 30:
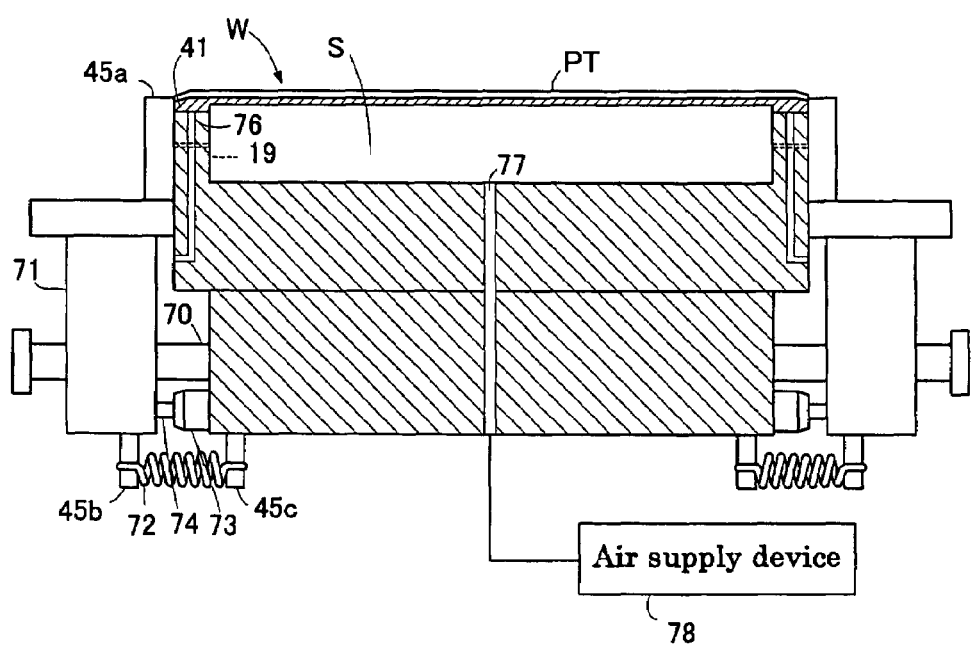
FIG. 30 is a front view illustrating an operation of the holding table in the another embodiment.

(4) A wafer W may be locked and secured on the holding table 6 in the following manner. For example, as illustrated in FIGS. 29 and 30, a pair of linear shafts 70 are provided at an outer periphery of the holding table 6, and linear bushes 71 are attached to the pair of linear shafts 70, respectively. A pair of locking pins 45a and 45b are provided at an upper end and a lower end of each linear bush 71. Further, a coil spring 72 stretches between the lower locking pin 46b and a locking pin 45c provided at a lower side of the holding table 6. That is, a spring force is generated such that the linear bush 71 moves toward the holding table 6. The holding table 6 further includes a pair of left and right air cylinders 73. When a piston rod 74 expands/contracts interlockingly with the actuation of the air cylinder 73, the linear bush 71 moves so as to be spaced away from the holding table 6 along the linear shaft 70.

Further, a circular recess 75 is formed on the top side of the holding table 6 so as to have a diameter approximate to a diameter of a ground area in a back face of the wafer W, and vacuum suction holes 76 are arranged in a ring shape along an outer periphery of the recess 75. Herein, each vacuum suction hole 76 acts on an annular convex portion 41 of the wafer W. In addition, an air supply hole 77 is formed on the top side of the holding table 6 so as to increase a pressure in a space S defined between a flat concave portion 40 of the wafer W and the recess 75 of the holding table 6, and is communicated with and connected to an external air supply device 78. Further, a plurality of fine holes are formed on a side wall of the annular convex portion 41 so as to communicate the space S with the outside. This configuration produces advantages similar to those in each of the aforementioned embodiments. Herein, since the space S is increased in volume, fluctuation in internal pressure with respect to an amount of air to be supplied into the space S is small. As a result, the internal pressure can be readily maintained at a predetermined pressure.

(5) In each of the aforementioned embodiments, the top side of the holding table 6, on which a wafer W is placed, is flat. As described in the aforementioned modification (4), alternatively, the circular recess 75 may be formed on the top side of the holding table 6 so as to have a diameter approximate to a diameter of a ground area in a back face of the wafer and the vacuum suction holes 76 may be arranged in a ring shape along an outer periphery of the recess 75. Herein, each vacuum suction hole 76 acts on an annular convex portion 41 of the wafer W. If a formation area of the annular convex portion 41 with respect to the holding table 6 is small, the vacuum suction holes 76 may not be formed.

The present invention may be embodied in other specific forms without departing from the spirit or essential attributes thereof and, accordingly, reference should be made to the appended claims, rather than to the foregoing specification, as indicating the scope of the invention.

What is claimed is:

1. An apparatus for joining a separating adhesive tape to a protective tape joined to a front face of a semiconductor wafer, the apparatus comprising:
    a semiconductor wafer having a back face on which an annular convex portion is formed along an outer periphery so as to surround a back-ground area and a flat concave portion is formed at an inner-diameter side of the annular convex portion;
    a holding table for holding said semiconductor wafer so as to come into contact with the annular convex portion formed on the back face of the semiconductor wafer, a surface of the holding table facing the flat concave portion being planar;

a locking member for locking the outer periphery of the annular convex portion of the semiconductor wafer held by the holding table;

fluid supply means for supplying fluid from a side of the holding table into a space defined between the back face of the semiconductor wafer and the holding table;

tape supply means for supplying a separating adhesive tape toward a surface of a protective tape joined to the semiconductor wafer; and a tape joining unit allowing a joining member, which has a width larger than an outer diameter of the semiconductor wafer, to move from a first end to a second end of the semiconductor wafer such that the joining member presses on a non-adhesive surface of the adhesive tape, thereby pressing the adhesive tape against the surface of the protective tape, for joining the adhesive tape to the surface of the protective tape.

2. The apparatus of claim 1, wherein
the locking member is locking pins provided in a pair of clamp members disposed so as to be opposite to each other with the semiconductor wafer interposed therebetween and moved so as to approach each other or so as to be spaced away from each other.

3. The apparatus of claim 1, wherein
the locking member is a pair of locking members each having a "V"-shaped recess, the locking members being disposed so as to be opposite to each other with the semiconductor wafer interposed therebetween and moved so as to approach each other or so as to be spaced away from each other.

4. The apparatus of claim 1, wherein
the holding table includes a recess communicated with the flat concave portion formed on the back face of the semiconductor wafer by grinding, and the annular convex portion of the semiconductor wafer is suction held by an outer periphery of the recess.

5. The apparatus of claim 1, further comprising:
means for adjusting an internal pressure in the space defined between the back face of the semiconductor wafer and the holding table while permitting an outflow of the fluid from the space.

6. An apparatus for separating from a semiconductor wafer a protective tape joined to a front face of the semiconductor wafer, the apparatus comprising:

a semiconductor wafer having a back face on which an annular convex portion is formed along an outer periphery so as to surround a back-ground area and a flat concave portion is formed at an inner-diameter side of the annular convex portion;

a holding table for holding said semiconductor wafer so as to come into contact with the annular convex portion formed on the back face of the semiconductor wafer, a surface of the holding table facing the flat concave portion being planar;

a locking member for locking the outer periphery of the annular convex portion of the semiconductor wafer held by the holding table;

fluid supply means for supplying fluid from a side of the holding table into a space defined between the back face of the semiconductor wafer and the holding table;

tape supply means for supplying a separating adhesive tape toward a surface of a protective tape joined to the semiconductor wafer; and a tape joining unit allowing a joining member, which has a width larger than an outer diameter of the semiconductor wafer, to move from a first end to a second end of the semiconductor wafer such that the joining member presses on a non-adhesive surface of the adhesive tape, thereby pressing the adhesive tape against the surface of the protective tape, for joining the adhesive tape to the surface of the protective tape; and separation means allowing a guide member, which moves from the first end to the second end of the semiconductor wafer, to guide the joined separating adhesive tape in a reverse direction, for separating the protective tape integrated with the adhesive tape from the front face of the semiconductor wafer.

7. The apparatus of claim 6, wherein
the locking member is locking pins provided in a pair of clamp members disposed so as to be opposite to each other with the semiconductor wafer interposed therebetween and moved so as to approach each other or so as to be spaced away from each other.

8. The apparatus of claim 6, wherein
the locking member is a pair of locking members each having a "V"-shaped recess, the locking members being disposed so as to be opposite to each other with the semiconductor wafer interposed therebetween and moved so as to approach each other or so as to be spaced away from each other.

9. The apparatus of claim 6, wherein
the holding table includes a recess communicated with the flat concave portion formed on the back face of the semiconductor wafer by grinding, and the annular convex portion of the semiconductor wafer is suction held by an outer periphery of the recess.

10. The apparatus of claim 6, further comprising:
means for adjusting an internal pressure in the space defined between the back face of the semiconductor wafer and the holding table while permitting an outflow of the fluid from the space.

11. An apparatus for joining a separating adhesive tape to a protective tape joined to a front face of a semiconductor wafer, the apparatus comprising:

a semiconductor wafer having a back face on which an annular convex portion is formed along an outer periphery so as to surround a back-ground area and a flat concave portion is formed at an inner-diameter side of the annular convex portion;

a holding table for holding said semiconductor wafer so as to come into contact with the annular convex portion formed on the back face of the semiconductor wafer, and having a ridge with a height which is equal to a depth of the flat concave portion so as to be fitted into the flat concave portion to receive the thin portion of the wafer;

a locking member for locking the outer periphery of the annular convex portion of the semiconductor wafer held by the holding table;

tape supply means for supplying a separating adhesive tape toward a surface of a protective tape joined to the semiconductor wafer; and a tape joining unit allowing a joining member, which has a width larger than an outer diameter of the semiconductor wafer, to move from a first end to a second end of the semiconductor wafer such that the joining member presses on a non-adhesive surface of the adhesive tape, thereby pressing the adhesive tape against the surface of the protective tape, for joining the adhesive tape to the surface of the protective tape.

12. An apparatus for separating from a semiconductor wafer a protective tape joined to a front face of the semiconductor wafer, the apparatus comprising:

a semiconductor wafer having a back face on which an annular convex portion is formed along an outer periphery so as to surround a back-ground area and a flat concave portion is formed at an inner-diameter side of the annular convex portion;

a holding table for holding said semiconductor wafer so as to come into contact with the annular convex portion formed on the back face of the semiconductor wafer, and having a ridge with a height which is equal to a depth of the flat concave portion so as to be fitted into the flat concave portion to receive the thin portion of the wafer;

a locking member for locking the outer periphery of the annular convex portion of the semiconductor wafer held by the holding table;

tape supply means for supplying a separating adhesive tape toward a surface of a protective tape joined to the semiconductor wafer;

a tape joining unit allowing a joining member, which has a width larger than an outer diameter of the semiconductor wafer, to move from a first end to a second end of the semiconductor wafer such that the joining member presses on a non-adhesive surface of the adhesive tape, thereby pressing the adhesive tape against the surface of the protective tape, for joining the adhesive tape to the surface of the protective tape; and separation means allowing a guide member, which moves from the first end to the second end of the semiconductor wafer, to guide the joined separating adhesive tape in a reverse direction, for separating the protective tape integrated with the adhesive tape from the front face of the semiconductor wafer.

13. A method for joining a separating adhesive tape to a protective tape joined to a front face of a semiconductor wafer using the apparatus of claim 1, the method comprising the steps of:

preparing a semiconductor wafer having a back face on which an annular convex portion is formed along an outer periphery so as to surround a back-ground area;

placing the semiconductor wafer on a holding table in a state that a front face of the semiconductor wafer is directed upward and, also, allowing a locking member of the holding table to support the outer periphery of the annular convex portion such that the locking member comes into contact with the outer periphery of the annular convex portion, for securing the semiconductor wafer;

supplying fluid from a side of the holding table into a space defined between the back face of the semiconductor wafer and the holding table, for increasing an internal pressure in the space;

supplying a separating adhesive tape toward a surface of a protective tape joined to the front face of the semiconductor wafer; and allowing a joining member, which has a width larger than an outer diameter of the semiconductor wafer, to move from a first end to a second end of the semiconductor wafer such that the joining member presses a non-adhesive surface of the adhesive tape against the surface of the protective tape, for joining the adhesive tape to the surface of the protective tape.

14. The method of claim 1, wherein the fluid is supplied into the space while an outflow of the fluid from the space is permitted, so that a pressure in the space is increased.

15. The method of claim 14, wherein the holding table includes a fine hole for permitting the outflow of the fluid.

16. The method of claim 13, wherein the joining member moves slowly at an adhesive tape joining start position.

17. The method of claim 16, wherein a pressing force of the joining member to be applied to the annular convex portion corresponding to the adhesive tape joining start position is larger than a pressing force of the joining member to be applied to a flat concave portion formed inside the annular convex portion.

18. A method for separating from a semiconductor wafer a protective tape joined to a front face of the semiconductor wafer using the apparatus of claim 6, the method comprising the steps of:

preparing a semiconductor wafer having a back face on which an annular convex portion is formed along an outer periphery so as to surround a back-ground area placing the semiconductor wafer on a holding table in a state that a front face of the semiconductor wafer is directed upward and, also, allowing a locking member of the holding table to support the outer periphery of the annular convex portion such that the locking member comes into contact with the outer periphery of the annular convex portion, for securing the semiconductor wafer;

supplying fluid from a side of the holding table into a space defined between the back face of the semiconductor wafer and the holding table, for increasing an internal pressure in the space;

supplying a separating adhesive tape toward a surface of a protective tape joined to the front face of the semiconductor wafer;

allowing a joining member, which has a width larger than an outer diameter of the semiconductor wafer, to move from a first end to a second end of the semiconductor wafer such that the joining member presses a non-adhesive surface of the adhesive tape against the surface of the protective tape, for joining the adhesive tape to the surface of the protective tape; and allowing a guide member, which moves from the first end to the second end of the semiconductor wafer, to guide the joined separating adhesive tape in a reverse direction, for separating the protective tape integrated with the adhesive tape from the front face of the semiconductor wafer.

19. The method of claim 18, wherein the guide member is used as the joining member so that the joining of the adhesive tape to the protective tape and the separation of the protective tape from the semiconductor wafer are performed simultaneously.

20. The method of claim 18, wherein the guide member is made of a plate material having an edge.

21. The method of claim 18, wherein the fluid is supplied into the space while an outflow of the fluid from the space is permitted, so that a pressure in the space is increased.

22. The method of claim 21, wherein the holding table includes a fine hole for permitting the outflow of the fluid.

23. The method of claim 18, wherein the joining member moves slowly at an adhesive tape joining start position.

24. The method of claim 23, wherein a pressing force of the joining member to be applied to the annular convex portion corresponding to the adhesive tape joining start position is larger than a pressing force of the joining member to be applied to a flat concave portion formed inside the annular convex portion.

* * * * *